(12) United States Patent
Wood et al.

(10) Patent No.: US 7,420,742 B2
(45) Date of Patent: Sep. 2, 2008

(54) OPTICALLY TRANSPARENT ELECTROMAGNETIC INTERFERENCE (EMI) SHIELDS FOR DIRECT-VIEW DISPLAYS

(75) Inventors: Robert L. Wood, Apex, NC (US); David L. Reed, Chapel Hill, NC (US)

(73) Assignee: Bright View Technologies, Inc., Morrisville, NC (US)

(*) Notice: Subject to any disclaimer, the term of this patent is extended or adjusted under 35 U.S.C. 154(b) by 193 days.

(21) Appl. No.: 11/378,189

(22) Filed: Mar. 17, 2006

(65) Prior Publication Data
US 2007/0127129 A1 Jun. 7, 2007

Related U.S. Application Data

(63) Continuation-in-part of application No. 11/364,423, filed on Feb. 28, 2006.

(60) Provisional application No. 60/748,271, filed on Dec. 7, 2005.

(51) Int. Cl.
*G02B 27/10* (2006.01)
(52) U.S. Cl. .................... 359/619; 174/32; 174/350
(58) Field of Classification Search .................. 313/10; 349/95; 359/619; 174/32, 350, 355, 357, 174/358
See application file for complete search history.

(56) References Cited

U.S. PATENT DOCUMENTS

| 4,172,219 A | 10/1979 | Deml et al. |
| 5,598,281 A | 1/1997 | Zimmerman et al. |
| 6,049,037 A | 4/2000 | Schlatmann |
| 6,086,979 A | 7/2000 | Kanbara et al. |

(Continued)

FOREIGN PATENT DOCUMENTS

| EP | 1 670 024 A2 | 6/2006 |
| JP | 2001154597 | 6/2001 |

OTHER PUBLICATIONS

Notification of Transmittal of the International Search Report and the Written Opinion of the International Searching Authority, or the Declaration; PCT/US2006/046453, May 7, 2007.

(Continued)

*Primary Examiner*—Scott J. Sugarman
*Assistant Examiner*—James R Greece
(74) *Attorney, Agent, or Firm*—Myers Bigel Sibley & Sajovec, P.A.

(57) ABSTRACT

Electromagnetic Interference (EMI) shields for a direct-view display having a direct-view display panel and an outer panel that provides an outer surface for the direct-view display. These EMI shields include a conductive mesh having an array of gaps therein. The conductive mesh is configured to shield at least some of the EMI that is emitted by the direct-view display panel. An optical redirecting structure is also included, that is configured to redirect at least some optical radiation that is emitted from the direct-view display panel that would strike the conductive mesh, through the gaps in the conductive mesh. The EMI shield is configured to mount between the direct-view display panel and the outer panel such that the optical redirecting structure is adjacent the direct-view display panel and the conductive mesh is remote from the direct-view display panel.

37 Claims, 14 Drawing Sheets

U.S. PATENT DOCUMENTS

| | | |
|---|---|---|
| 6,399,879 B1 | 6/2002 | Ueda et al. |
| 6,492,587 B1 | 12/2002 | Yoshinaga |
| 6,788,460 B2 | 9/2004 | Knox et al. |
| 6,816,306 B2 | 11/2004 | Freese et al. |
| 6,829,087 B2 | 12/2004 | Freese et al. |
| 6,967,779 B2 | 11/2005 | Fadel et al. |
| 2002/0039157 A1* | 4/2002 | Nakanishi et al. ............. 349/95 |
| 2003/0206342 A1 | 11/2003 | Reed et al. |
| 2004/0017612 A1 | 1/2004 | Fadel et al. |
| 2005/0058947 A1 | 3/2005 | Rinehart et al. |
| 2005/0058948 A1 | 3/2005 | Freese et al. |
| 2005/0058949 A1 | 3/2005 | Wood et al. |
| 2005/0236987 A1 | 10/2005 | Okazaki et al. |
| 2005/0253493 A1* | 11/2005 | Park et al. .................. 313/110 |

OTHER PUBLICATIONS

Notification of Transmittal of the International Search Report and the Written Opinion of the International Searching Authority, or the Declaration; International Search Report; and Written Opinion of the International Searching Authority, PCT/US2006/046454, Mar. 27, 2007.

* cited by examiner

OPTICALLY TRANSPARENT ELECTROMAGNETIC INTERFERENCE (EMI) SHIELDS FOR DIRECT-VIEW DISPLAYS

CROSS-REFERENCE TO RELATED APPLICATION

This application is a continuation-in-part (CIP) of application Ser. No. 11/364,423, filed Feb. 28, 2006, entitled Contrast Enhancement Films for Direct-View Displays and Fabrication Methods Therefor, which itself claims the benefit of provisional application Ser. No. 60/748,271, filed Dec. 7, 2005 entitled Contrast Enhancement Films for Direct-View Displays and Fabrication Methods Therefor. All of the above applications are assigned to the assignee of the present application, the disclosures of which are hereby incorporated herein by reference in their entirety as if set forth fully herein.

FIELD OF THE INVENTION

This invention relates to optical systems, devices, processes and fabrication methods, and more particularly to Electromagnetic Interference (EMI) shields, systems and operations using same, and methods of fabricating same.

BACKGROUND OF THE INVENTION

Electromagnetic Interference shields, also referred to as EMI shields, are widely used in direct-view electronic displays to suppress unwanted radiation of electromagnetic energy or electromagnetic interference. Displays such as Cathode Ray Tube (CRT) and plasma display panels can produce undesirable EMI emissions that generally must be reduced to levels dictated by various regulatory agencies such as the Federal Communications Commission (FCC). One known type of EMI shield is constructed, for example, by bonding an electrically conductive mesh to a transparent substrate such as glass or plastic. Such EMI shields are described, for example, in U.S. Pat. Nos. 6,399,879; 6,492,587; 6,049,037; and 6,086,979.

A major potential drawback common to these types of construction is the general loss of imaging light, or display brightness, caused by the EMI shield. In particular, a metallic EMI shield that passes visible light while efficiently blocking RF energy generally uses a fine mesh (e.g. about 50 μm or finer) composed of solid conductors with an array of gaps between the conductors that are small compared to the wavelength of radio frequency (RF) energy (i.e. several mm to a few cm in typical displays). Conventional conductive materials such as copper or aluminum are not transparent to visible light and therefore block some of the display light, resulting in loss of brightness. Transparent conductors such as Indium Tin Oxide (ITO) can provide conductivity without impairing visible transmission, but the conductivity of this material is generally relatively low and it is generally very expensive compared to common metals. The conductor pattern should also be sufficiently small so that it is not visible to the unaided eye.

Commercial EMI shield products have been created that can provide effective EMI shielding within regulatory limits, but these products generally have low visible light transmission ranging from about 40% to about 60%. Improving this transmission would not only provide a brighter display, but may permit the display to operate at lower power, hence more efficiently, and with less heat generation and/or with longer life.

SUMMARY OF THE INVENTION

Some embodiments of the present invention provide electromagnetic interference (EMI) shields for a direct-view display having a direct-view display panel and an outer panel that provides an outer surface for the direct-view display. These EMI shields include a conductive mesh having an array of gaps therein. The conductive mesh is configured to shield at least some of the EMI that is emitted by the direct-view display panel. An optical redirecting structure is also included, that is configured to redirect at least some optical radiation that is emitted from the direct-view display panel that would strike the conductive mesh, through the gaps in the conductive mesh. The EMI shield is configured to mount between the direct-view display panel and the outer panel such that the optical redirecting structure is adjacent the direct-view display panel and the conductive mesh is remote from the direct-view display panel.

In some embodiments, the optical redirecting structure comprises an array of optical microstructures. In some embodiments, the array of optical microstructures defines a nonplanar surface and the EMI shield further includes a cladding layer on the nonplanar surface of the optical microstructures such that the cladding layer provides a planar surface opposite the nonplanar surface of the optical microstructures. The cladding layer may have a different index of refraction than the optical microstructures.

In other embodiments, a substrate having first and second opposing sides is provided. The array of optical microstructures is on the first side of the substrate and the conductive mesh is on the second side of the substrate. In other embodiments, a bonding substrate also may be provided on the array of optical microstructures opposite the substrate and an adhesive layer may be provided on the bonding substrate that is configured to mount the EMI shield between the direct-view display panel and the outer panel. In yet other embodiments, the array of optical microstructures itself may include an adhesive surface that is configured to mount the EMI shield between the direct-view display panel and the outer panel. Other embodiments of adhesive layers also may be provided, that are configured to mount the EMI shield between the direct-view display and the outer panel.

In yet other embodiments of EMI shields, the conductive mesh consists of an array of horizontally oriented conductors or an array of vertically oriented conductors. In still other embodiments, the conductive mesh comprises a base conductive layer and an overlayer conductive layer. The base conductive layer may be a plating base conductive layer and the overlayer conductive layer may be a plated conductive layer.

In still other embodiments, EMI shields according to any of the above-described embodiments may be combined with a contrast enhancement film for the direct-view display. The contrast enhancement film includes a substrate having first and second opposing sides, an array of optical microstructures on the first side of the substrate and an optically blocking film including an array of apertures therein on the second side of the substrate. The optically blocking film may comprise an electrically conductive film. The contrast enhancement film is also configured to mount between the direct-view display panel and the outer panel. In some embodiments, the contrast enhancement film is adjacent the direct-view panel and the EMI shield is remote from the direct-view display panel. In other embodiments, the EMI shield is adjacent the direct-view display panel and the contrast enhancement film is remote from the outer panel.

Moreover, in other embodiments, the conductive mesh of the EMI shield includes a different ratio of gap area to mesh area than a ratio of aperture area to optically blocking film area in the contrast enhancement film. In some embodiments, the conductive mesh includes a larger ratio of gap area to mesh area than a ratio of aperture area to optically blocking film area in the contrast enhancement film.

Moreover, in still other embodiments, one of the conductive mesh of the EMI shield or the electrically conductive film of the contrast enhancement film consists of an array of horizontally oriented conductors, and the other of the conductive mesh of the EMI shield or the electrically conductive film of the contrast enhancement film consists of an array of vertically oriented conductors. The array of horizontally oriented conductors and/or the array of vertically oriented conductors may comprise an array of multilayer conductors including a base conductor layer and an overlayer conductor layer. The base conductor layer may be a plating base conductor layer and the overlayer conductor layer may be a plated conductor layer.

EMI shields according to various embodiments of the present invention that were described above may also be combined with conventional EMI shields that include a conductive mesh having an array of gaps therein, but that is free of an optical redirecting structure as was described above. In some embodiments, the conductive meshes include different ratios of gap area to mesh area. In other embodiments, one of the conductive meshes may consist of horizontally oriented conductors and the other of the conductive meshes may consist of vertically oriented conductors. In either case, the conductive mesh may comprise a base conductive layer, such as a plating base conductive layer, and an overlayer conductive layer, such as a plated conductive overlayer.

EMI shielding methods according to some embodiments of the present invention direct at least some optical radiation that is emitted from a direct-view display panel through gaps in a conductive EMI shield mesh on the direct-view display panel. At least some optical radiation that is emitted from the direct-view display panel that would strike the conductive mesh is redirected through gaps in the conductive EMI shielding mesh. Redirecting may be performed using an array of optical microstructures configured according to any of the above-described embodiments.

DETAILED DESCRIPTION

Figure 1:
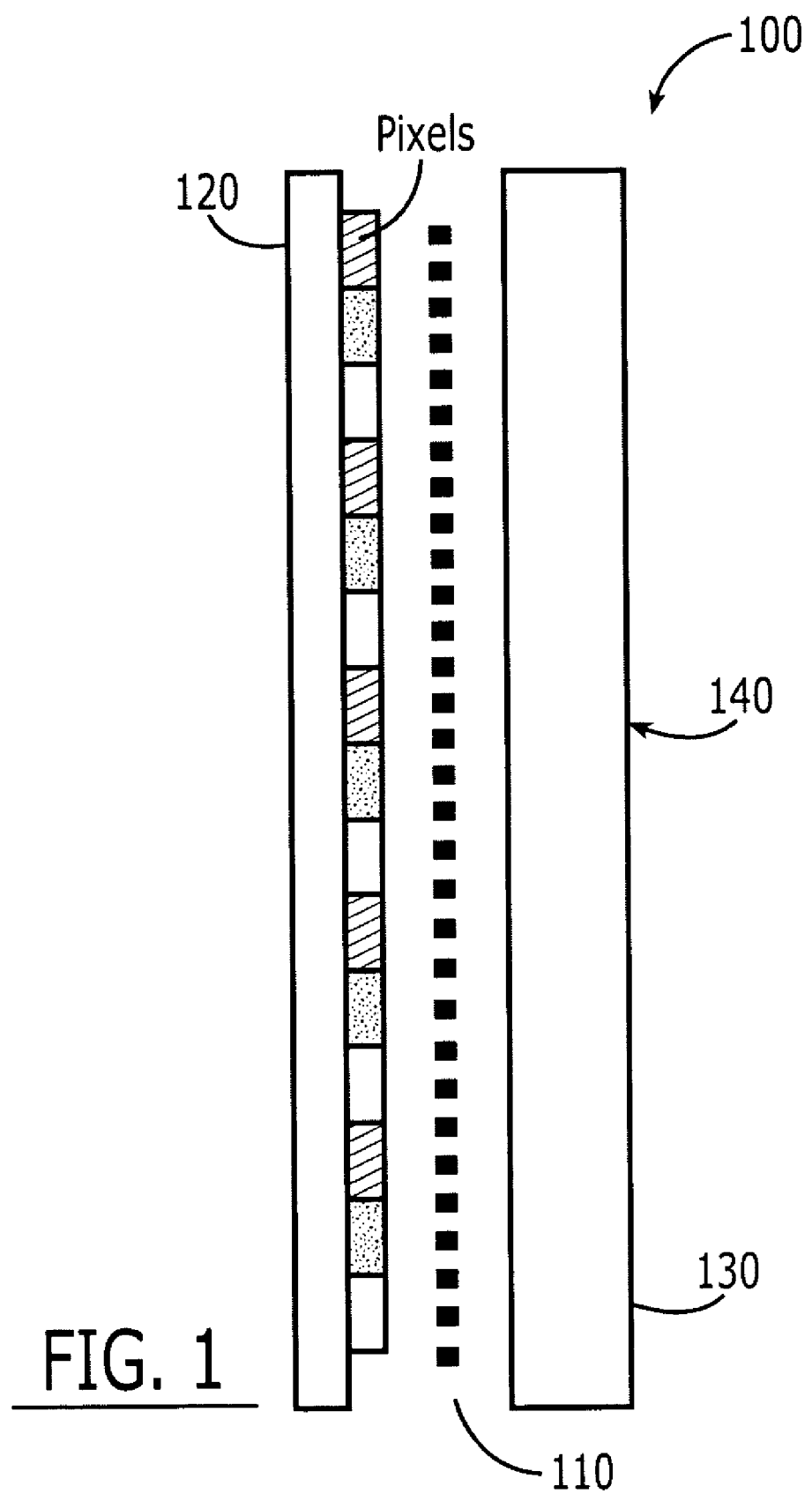
FIG. 1 is a cross-sectional view of a direct-view display including an EMI shield according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Finally, when light is referred to as "directly passing," it means that a reflector-free path is provided.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention. Moreover, the terms "front" and "back" may be used herein to describe opposing outward faces of a display screen. Conventionally, the viewing face is deemed the front, but the viewing face may also be deemed the back, depending on orientation.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some of the embodiments of the invention can provide EMI shield constructions compatible with displays requiring EMI suppression such as CRT and plasma televisions. EMI shield constructions according to some embodiments of the invention include optical functionality that can improve the overall optical transmission of these shields in order to provide a brighter and/or more efficient display. Some embodiments of the invention couple optical microstructures with the individual conductive elements in an EMI shield conductive mesh. These optical microstructures are designed to re-route at least some of the visible light that would otherwise strike the opaque conductors of the mesh. This light is channeled into the gaps between the conductors so that the light may combine with unblocked light to increase the total optical transmission of the EMI shield. In contrast with conventional EMI shields that may only transmit about 40% to about 60% of emitted light, some embodiments of the invention can transmit up to about 80% or more of the emitted light. A multilayer film construction may be provided that incorporates this optical functionality with the conductor mesh, support layer, and adhesive layer for attachment of the film to the display panel.

FIG. 1 shows a general implementation of an EMI shield 110 for a direct-view display 100 according to exemplary embodiments of the invention. The direct-view display 100 includes a direct-view display panel 120 and an outer panel 130 that provides an outer surface or "viewer side" 140 for the direct-view display 100. The EMI shield 110 may be adhesively applied to the display panel 120, for example the plasma panel in the case of a Plasma Display Panel (PDP) television. The outer panel 130 will generally be clamped at its edges, and may include an antireflection layer and/or antiglare layer on its outer surface. The outer panel 130 provides mechanical rigidity and protection of the inner display components 120.

Figure 2A:
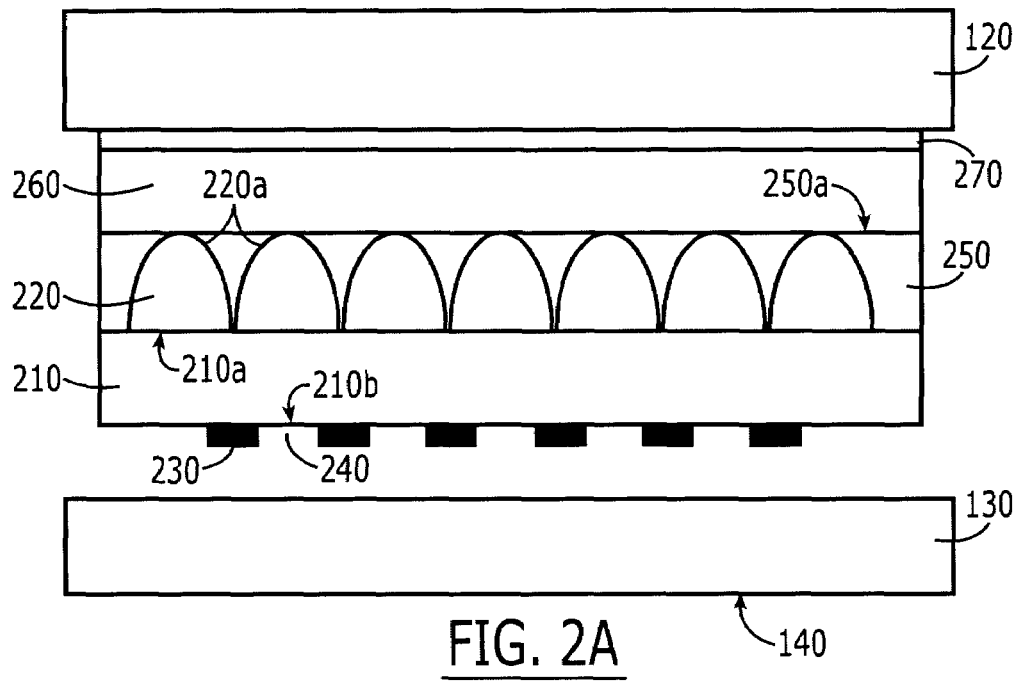
FIGS. 2A-2C are cross-sectional views of EMI shields according to some embodiments of the invention.
Figure 2B:
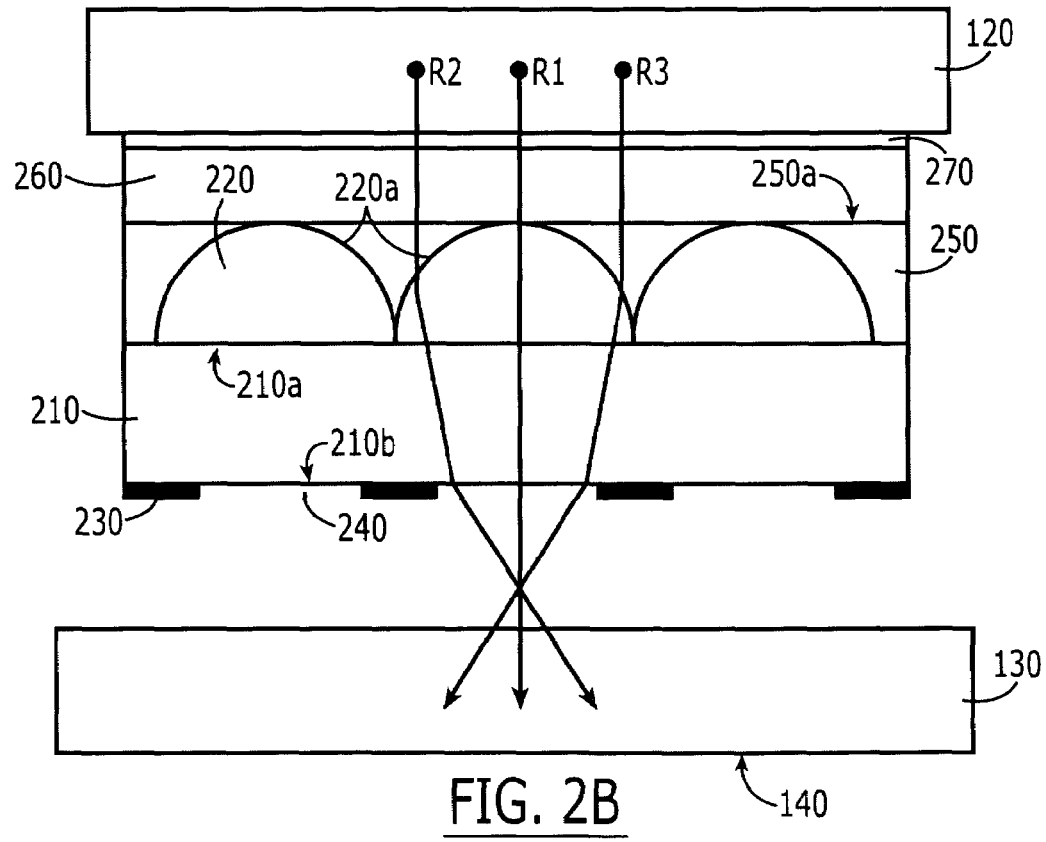
Figure 2C:
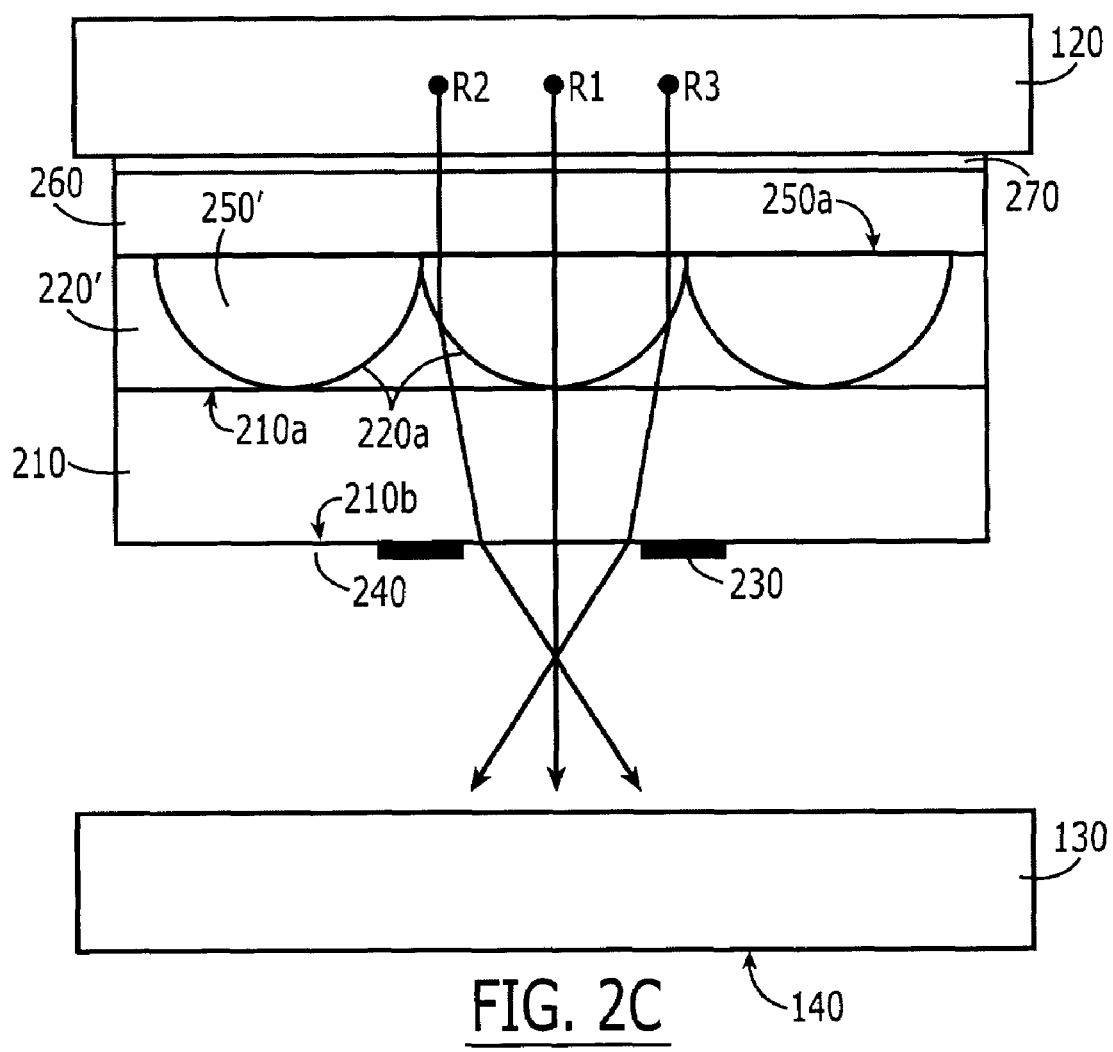

Various embodiments of the invention will now be illustrated with respect to FIGS. 2A-2C. These embodiments shall be regarded as merely illustrative and shall not be construed as limiting the invention. Moreover, the embodiments described and illustrated herein may be combined in various combinations and subcombinations.

FIGS. 2A-2C are cross-sectional views of contrast enhancement films according to some embodiments of the present invention. More specifically, referring to FIG. 2A, a first substrate 210 includes first and second opposing sides (faces) 210a, 210b, respectively. An array of optical microstructures 220 is provided on the first side 210a of the first substrate 210. It will be understood by those having skill in the art that, in some embodiments, the first substrate 210 is integrated with the optical microstructures 220, and may actually be embodied as the base of the optical microstructures 220. A conductive mesh 230, including an array of gaps 240 therein, is provided on the second side 210b of the first substrate 210. The array of gaps 240 are in registry with the array of optical microstructures 220. For example, in some embodiments, a respective gap is centered (aligned) on a respective axis of a respective optical microstructure. In other embodiments, a respective aperture may be offset from a respective axis. Multiple gaps per optical microstructure may also be provided. The gaps may be of any shape, including circular, ellipsoidal, polygonal and/or elongated (striped).

Still continuing with the description of FIG. 2A, the array of optical microstructures 220 defines a nonplanar surface 220a. A cladding layer 250 is provided on the nonplanar surface 220a of the optical microstructures 220. The cladding layer 250 includes a planar surface 250a opposite the nonplanar surface 220a of the optical microstructures 220. In some embodiments, the cladding layer 250 has a different index of refraction, such as a lower index of refraction, than the optical microstructures 220. More specifically, the optical microstructures 220 of FIG. 2A are designed to refract light away from the mesh 230 so that this light is not lost through absorption by the mesh 230. Any microstructure that can provide localized convergence or divergence of light in a prescribed manner may be used. The cladding layer 250 may cooperate with the optical microstructures 220 to produce refraction of light in the desired directions.

In some embodiments, the optical microstructures 220 may have a refractive index between about 1.5 and about 1.7 while the cladding layer 250 may have a refractive index between about 1.3 and about 1.4. In other embodiments, the optical microstructures 220 may have a refractive index between about 1.3 and about 1.4 and the cladding layer 250 may have a refractive index between about 1.5 and about 1.7. The difference between the refractive index of the optical microstructures 220 and the cladding layer 250 may be between about 0.05 and about 0.15 in some embodiments of the present invention.

FIGS. 2B and 2C illustrate EMI shields according to some embodiments of the present invention from an optical perspective. In embodiments of FIG. 2B, the optical microstructures 220 act as simple lenses and cause localized deflection of light that would otherwise strike the mesh 230. In embodiments of FIG. 2B, the refractive index of the microstructures 220 is higher than that of the cladding layer 250 so the convex shape of the microstructures 220 produces optical refraction that channels the light into the transparent open regions (gaps) 240 of the mesh 230. In contrast, in FIG. 2C, the refractive index of the microstructures 220' is lower than that of the cladding layer 250'. Optical refraction by the concave optical microstructures 220' thereby creates convergence of light rays into the transparent open regions of the mesh.

Still referring to FIGS. 2A-2C, a second substrate 260 may be provided on the planar surface 250a of the cladding layer 250/250'. An adhesive 270 may be provided on the second substrate 260. The adhesive 270 may be mounted on a display panel 120, so that the EMI shield extends between the direct-view display panel 120 and the outer panel 130. In other embodiments, the second substrate 260 need not be provided, and the adhesive 270 may be provided directly on the planar surface 250a of the cladding layer 250/250'. One or more intervening layers also may be provided. Moreover, in other embodiments, the adhesive 270 may be provided to mount the contrast enhancement film on the outer panel of the display.

EMI shields having structures shown in FIGS. 2A-2C may be constructed by forming optical microstructures 220/220' on a surface 210a of a transparent substrate 210 such as glass or plastic. The microstructure 220/220' may be microreplicated as will be described below. A conductor pattern (mesh) 230 is patterned on the opposite side 210b of the substrate 210 and may generally be in registry with the microstructures 220/220'. The conductor pattern (mesh) 230 may be any conventional conductor such as aluminum, silver, copper, gold, or the like having sufficient thickness to provide effective EMI shielding. The surface of the conductors may be blackened to improve contrast of the display. The conductor mesh 230 may be deposited by lithographic patterning following by etching or electroplating or electroless plating; by screen printing of a conductive ink containing a conductive metal; by pattern-wise printing of a conductive ink using an offset, intaglio and/or similar printing methods; by ink jet printing; and/or by self aligned ejection of a continuous conductor layer or conductor precursor layer by illumination of such layer through the microstructures such that light is concentrated in areas generally coaxial with the microstructures and such light is of sufficient energy to cause localized ejection of the layer, creating transparent regions coincident with the concentrated light area. Combinations of these techniques also may be used, and the conductor layer may constitute a multilayer structure containing more than one conductor layer.

For example, an EMI shield having a structure shown in FIGS. 2A-2C may be constructed by microreplicating an optical microstructure layer 220/220' having an array of projections on one side of a 50 μm thick polyester base first substrate 210. Other substrate materials that could be used include polycarbonate film, acrylic film, acetate film and glass, among others. Individual convex lens-like projections 220 may be approximately 80 μm in width and about 50 μm in height. The lens-like projections may be replicated from a master using a photopolymer with cured refractive index of about 1.5. The lens-like projections may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087 and/or 6,816,306, the disclosures of which are hereby incorporated herein by reference in their entirety as if set forth fully herein. The optical microstructures 220/220' need not be limited to lens-like projections, but may also take many other forms such as prisms and complex polyhedra as well as combinations of shapes. Other techniques and materials may be used for replicating the microstructures. Some of these include injection molding, embossing, calendaring, thermoplastic and thermoset resins, and room temperature vulcanizing one-part and two-part systems.

This optical microstructure layer 220/220' may be over-layered with a planar cladding layer 250/250' having a refractive index of, for example, about 1.4 by flowing a room temperature-vulcanizing silicone composition between the optical microstructure layer and a planar sheet of polyester having a thickness of about 175 μm, followed by curing at room temperature. Other cladding materials that may be used include higher index polymers such as polystyrene, novolak resin, polyhydroxystyrene, polycarbonates and/or polysulfones; and lower refractive index materials such as various siloxane-containing polymers and fluoro- and perfluoroacrylate polymers and/or copolymers.

The surface opposite the over-layered optical microstructure may be coated with a conductive layer of aluminum that is about 0.05-0.10 μm thick. Other conductive layers can be used. The aluminum layer may be exposed to high-energy laser pulses with a wavelength of 1.0 μm from a YAG laser source, with the laser impinging on the optical microstructure side (the top of FIGS. 2A-2C). The optical microstructures 220/220', modified by the cladding layer 250/250', cause weak focusing or convergence of laser light into bright zones in the conductive layer. This creates "shadowed" zones between the bright zones. Aluminum in the bright zones is ejected due to the absorption of laser energy within these zones, creating gaps 240 in registry with each optical microstructure 220/220'. The conductive layer in the shadowed zones remains intact to create the mesh 230. The apertures may be fabricated, for example, as described in U.S. Pat. Nos. 6,967,779 and/or 4,172,219.

The composite film is mounted to a direct-view display with the optical microstructure side (the top of FIGS. 2A-2C) towards the direct-view display panel 120 and the conductive mesh 330 toward the viewer side 140.

The cladding layer 250/250' of FIGS. 2A-2C may be chosen to have a refractive index that differs from that of the optical microstructures 220, and has high optical transparency. The difference in refractive index may typically be between about 0.05 and about 0.15. The refractive index difference determines the ability of the optical microstructures 220/220' to cause refraction of the incoming light. Overlaying the cladding layer 250/250' can provide a planar outer surface for attachment of a bonding substrate 260, which can be a transparent carrier layer having an adhesive backing 270 for attachment to the display. In this example, a polyester bonding substrate 260 with 7 mil thickness is used. Other bonding substrate materials may be used, such as glass, polycarbonate film, acrylic film, acetate film, and/or the like.

The upper surface of this bonding substrate may be covered with a conventional pressure-sensitive adhesive 270 for attachment to the display panel 120. Alternatively, the cladding planar surface 250a may be directly attached to a display surface using a separate transparent adhesive layer 270. Without the cladding 250, attachment to the display may be very difficult to accomplish without severely degrading the refractive power of the optical microstructure 220. The cladding layer 250 also can weaken the optical microstructure power considerably, thereby reducing its convergence in the mesh 230. This can result in larger gaps 240. Moreover, in some embodiments, the adhesive layer may be applied directly to the cladding layer rather than through a bonding substrate. In still other embodiments, the outer surface 220a of the optical microstructures 220/220' may be tacky and may be used to adhesively mount the optical microstructures 220/220' to the display panel 120 as described in more detail below.

FIGS. 2B and 2C also illustrate EMI shielding methods for direct-view displays according to some embodiments of the present invention. More specifically, as shown in FIGS. 2B and 2C at least some optical radiation that is emitted from the direct-view display panel, shown as the center ray R1 of FIGS. 2B and 2C is directed through the gaps 240 in the conductive mesh 230. Moreover, at least some of the optical radiation that is emitted from the direct-view display panel that would strike the conductive EMI shield mesh 230 is redirected through the gaps 240 in the conductive EMI shield mesh 230 as shown by the second and third rays R2 and R3 of FIGS. 2B and 2C EMI shields according to embodiments of the present invention may also be combined with contrast enhancement films that were described in parent application Ser. No. 11/364,423. In some embodiments, the EMI shield may be adjacent the direct-view display panel 120 and the contrast enhancing film may be remote from the direct-view display panel 120 and adjacent the outer panel 130. In other embodiments, the relative locations may be reversed such that the contrast enhancement film is adjacent the direct-view display panel 120 and the EMI shield is on the contrast enhancement film remote from the direct-view display panel 120 and adjacent the outer panel 130. Specific embodiments will be described below.

When both a contrast enhancement film and an EMI shield are provided, according to some embodiments of the present invention, both the contrast enhancement film and the EMI shield may collectively operate to reduce EMI. Less burden may thereby be placed on the EMI shield itself. The EMI shield may therefore have larger gaps in the mesh to allow more light to be transmitted through the EMI shield. More specifically, according to some embodiments of the present invention, the conductive mesh of the EMI shield may have a different ratio of gap area to mesh area than a ratio of aperture area to optically blocking film area in the contrast enhancement film. In some embodiments the conductive mesh includes a larger ratio of gap area to mesh area than a ratio of aperture area to optically blocking film area in the contrast enhancement film. Thus, less opaque EMI shields may be provided than is conventionally the case, when an EMI shield according to embodiments of the present invention is combined with a contrast enhancement field according to embodiments of the present invention.

The combination of the contrast enhancement film according to some embodiments of the present invention with an EMI shield according to some embodiments of the invention will be illustrated below in connection with FIG. 10. First, however, various embodiments of contrast enhancement films according to various embodiments of the invention will now be illustrated with respect to FIGS. 3A-9B. These embodiments shall be regarded as merely illustrative and shall not be construed as limiting the invention. Moreover, the embodiments described and illustrated herein may be combined in various combinations and subcombinations. These embodiments of contrast enhanced films are described in detail in application Ser. No. 11/364,423.

Figure 3A:
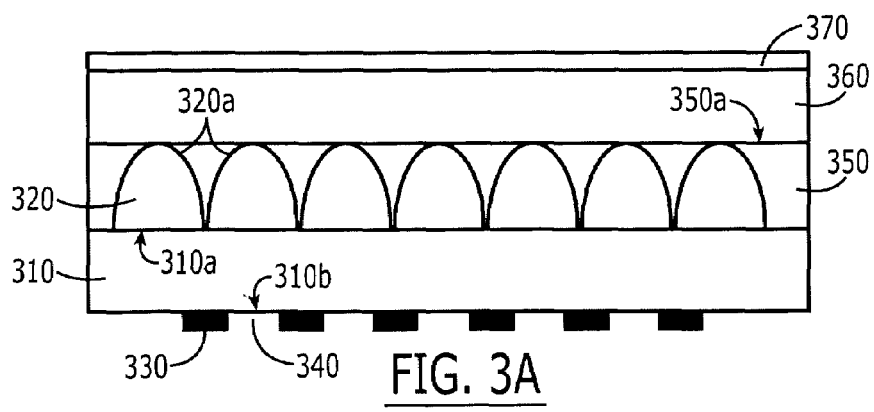
FIGS. 3A and 3B are cross-sectional views of contrast enhancement films according to some embodiments of the present invention from a structural and optical perspective, respectively.
Figure 3B:
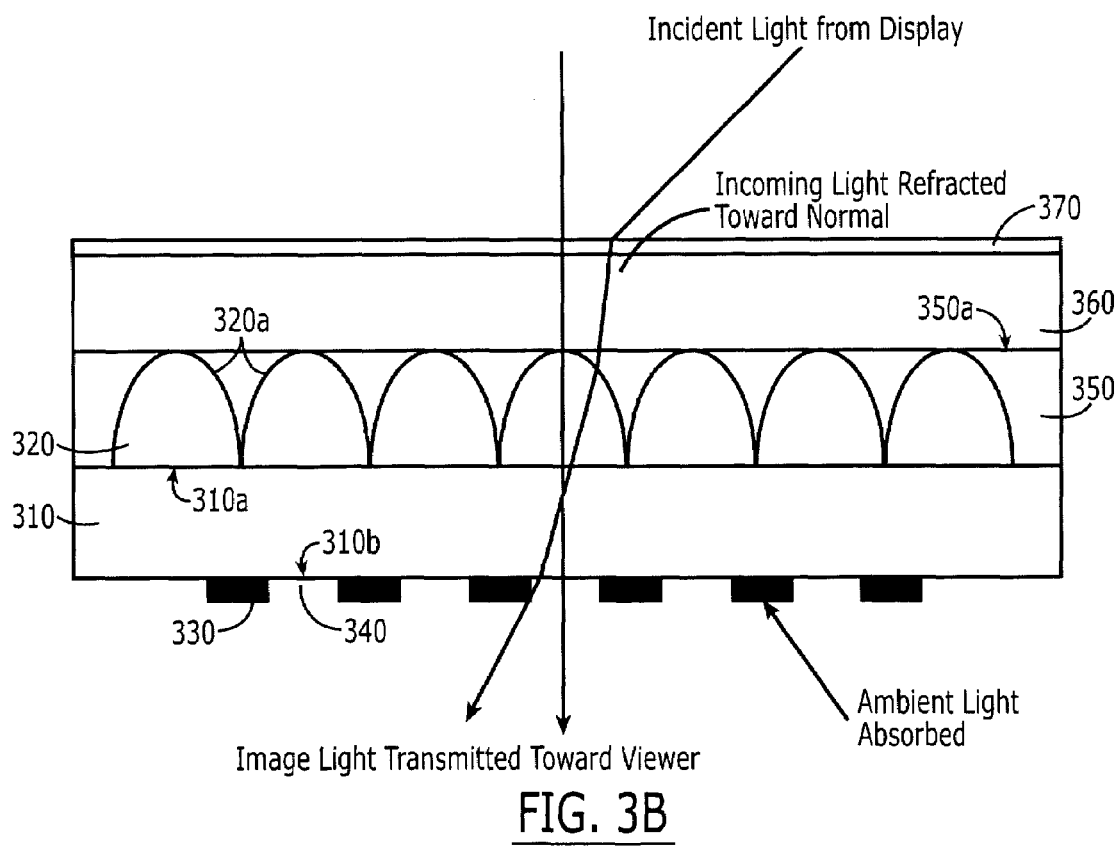

FIGS. 3A and 3B are cross-sectional views of contrast enhancement films according to some embodiments of the present invention from a structural and optical perspective, respectively. More specifically, referring to FIGS. 3A and 3B, a first substrate 310 includes first and second opposing sides (faces) 310*a*, 310*b*, respectively. An array of optical microstructures 320 is provided on the first side 310*a* of the first substrate 310. It will be understood by those having skill in the art that, in some embodiments, the first substrate 310 is integrated with the optical microstructures 320, and may actually be embodied as the base of the optical microstructures 320. An optically blocking film 330, including an array of apertures 340 therein, is provided on the second side 310*b* of the first substrate 310. The array of apertures 340 are in registry with the array of optical microstructures 320. For example, in some embodiments, a respective aperture is centered (aligned) on a respective axis of a respective optical microstructure. In other embodiments, a respective aperture may be offset from a respective axis. Multiple apertures per optical microstructure may also be provided. The apertures may be of any shape, including circular, ellipsoidal, polygonal and/or elongated (striped).

In some embodiments of the invention, the array of optical microstructures 320 comprises an array of horizontally extending lenticular microlenses, such as cylindrical section microlenses as illustrated in FIGS. 3A and 3B. It has been found, according to some embodiments of the present invention, that horizontally extending lenticular microlenses can reduce or eliminate acceptance angle issues with Lambertian sources, so that embodiments of the present invention can be used as contrast enhancement films for direct-view displays. The horizontally extending lenticular microlenses may be contrasted with conventional vertically extending lenticular microlens arrays that may be used for other display applications. Moreover, in still other embodiments, the lens geometry may be optically weakened, as described below, so as to create larger apertures 340 in the optically blocking film 330 and thereby also increase the acceptance angle for a Lambertian source.

Still continuing with the description of FIG. 3A, the array of optical microstructures 320 defines a nonplanar surface 320*a*. A cladding layer 350 is provided on the nonplanar surface 320*a* of the optical microstructures 320. The cladding layer 350 includes a planar surface 350*a* opposite the nonplanar surface 320*a* of the optical microstructures 320. In some embodiments, the cladding layer 350 has a lower index of refraction than the optical microstructures 320. For example, the optical microstructures 320 may have an index of refraction (N) of about 1.5, and the cladding layer 350 may have an index of refraction of about 1.4.

Still referring to FIG. 3A, a second substrate 360 may be provided on the planar surface 350*a* of the cladding layer 350. An adhesive 370 may be provided on the second substrate 360. The adhesive 370 may be mounted on a display panel 120, so that the contrast enhancement film extends between the direct-view display panel 120 and the outer panel 130. In other embodiments, the second substrate 360 need not be provided, and the adhesive 370 may be provided directly on the planar surface 350*a* of the cladding layer 350. One or more intervening layers also may be provided. Moreover, in other embodiments, the adhesive 370 may be provided to mount the contrast enhancement film in the outer panel of the display.

A contrast enhancement film having a structure shown in FIG. 3A may be constructed by microreplicating an optical microstructure layer 320 having an array of cylindrical lens-like projections on one side of a 50 µm thick polyester base first substrate 310. Other substrate materials that could be used include polycarbonate film, acrylic film, acetate film and glass, among others. Individual convex lens-like projections may be approximately 80 µm in width and about 50 µm in height. The lens-like projections may be replicated from a master using a photopolymer with cured refractive index of about 1.50. The lens-like projections may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087 and/or 6,816,306, the disclosures of which are hereby incorporated herein by reference in their entirety as if set forth fully herein. The optical microstructures 320 need not be limited to lens-like projections, but may also take many other forms such as prisms and complex polyhedra as well as combinations of shapes. Other techniques and materials may be used for replicating the microstructures. Some of these include injection molding, embossing, calendaring, thermoplastic and thermoset resins, and room temperature vulcanizing one-part and two-part systems.

This optical microstructure layer may be over-layered with a planar cladding layer 350 having a refractive index of, for example, about 1.4 by flowing a room temperature-vulcanizing silicone composition between the optical microstructure layer and a planar sheet of polyester having a thickness of about 175 µm followed by curing at room temperature. Other cladding materials that may be used include higher index polymers such as polystyrene, novolak resin, polyhydroxystyrene, polycarbonates and/or polysulfones; and lower refractive index materials such as various siloxane-containing polymers and fluoro- and perfluoroacrylate polymers and/or copolymers. In the case of higher index cladding material 350, the optical microstructures 320 may be in the form of concave lens-like projections. The optical microstructures 320 need not be limited to lens-like projections, but may also take many other forms such as prisms and complex polyhedra as well as combinations of shapes.

The surface opposite the over-layered optical microstructure may be coated with a 4 μm thickness of carbon black 330 in an organic binder. Other light-absorbing layers, referred to herein as "black" layers, can be used such as titanium carbide, tantalum nitride, anodized aluminum, and the like. The carbon black layer 330 may be exposed to high-energy laser pulses with a wavelength of about 1.0 μm from a YAG laser source, with the laser impinging on the optical microstructure side (the top of FIG. 3A). The optical microstructures 320, modified by the cladding layer 350, cause weak focusing or convergence of laser light into bright zones in the carbon black layer 330. This creates "shadowed" zones between the bright zones. Carbon in the bright zones is ejected due to the absorption of laser energy within these zones, creating apertures 340 in registry with each optical microstructure. The carbon layer in the shadowed zones remains intact. The apertures may be fabricated, for example, as described in U.S. Pat. Nos. 6,967,779 and/or 4,172,219.

The composite film is mounted to a Lambertian-like display with the optical microstructure side (the top of FIG. 3A) towards the direct-view display panel 120 and the carbon black layer 330 toward the viewer side 140. As shown in FIG. 3B, light arriving from the display panel 120 that falls within the acceptance angle of the optical microstructure/aperture combination is passed through the aperture 340 and on toward the viewer. Ambient light falling on the screen is attenuated by direct absorption in the carbon black layer 330.

The cladding layer 350 in the film of FIGS. 3A and 3B may be chosen to have a refractive index that differs from that of the optical microstructures 320, and has high optical transparency. The difference in refractive index may typically be 0.1 or greater. The refractive index difference determines the ability of the optical microstructures 320 to cause refraction of the incoming light. This refraction may be performed in order to form bright zones and shadowed zones in the carbon black layer 330. Where the cladding layer 350 has a higher refractive index than the optical microstructures 320, the optical microstructures may take the form of concave lens-like projections. Conversely, when the cladding layer 350 has an index less than the microstructures 320, it may take the form of convex lens-like projections. Overlaying the cladding layer 350 provides a planar upper surface for attachment of a bonding substrate 360, which can be a transparent carrier layer having an adhesive backing 370 for attachment to the display. In this example, a polyester bonding substrate 360 with 7 mil thickness is used. Other bonding substrate materials may be used, such as glass, polycarbonate film, acrylic film, acetate film, and/or the like.

The upper surface of this bonding substrate may be covered with a conventional pressure-sensitive adhesive 370 for attachment to the display panel 120. Alternatively, the planar cladding planar surface 350a may be directly attached to a display surface using a separate transparent adhesive layer 370. Without the cladding 350, attachment to the display may be very difficult to accomplish without severely degrading the refractive power of the optical microstructure 320. The cladding layer 350 in the film of FIGS. 3A and 3B also can help to re-orient incoming light toward the normal, as shown in FIG. 3B, which can improve the likelihood that image light will fall within the acceptance angle of the optical microstructure/aperture combination. The cladding layer 350 also can weaken the optical microstructure power considerably, thereby reducing its convergence in the black layer 330. This can result in larger apertures 340, which in turn can improve the acceptance angle of the optical microstructure/aperture combination. These effects can combine to provide high efficiency and good ambient light blocking capability on a Lambertian-like source.

Figure 4A:
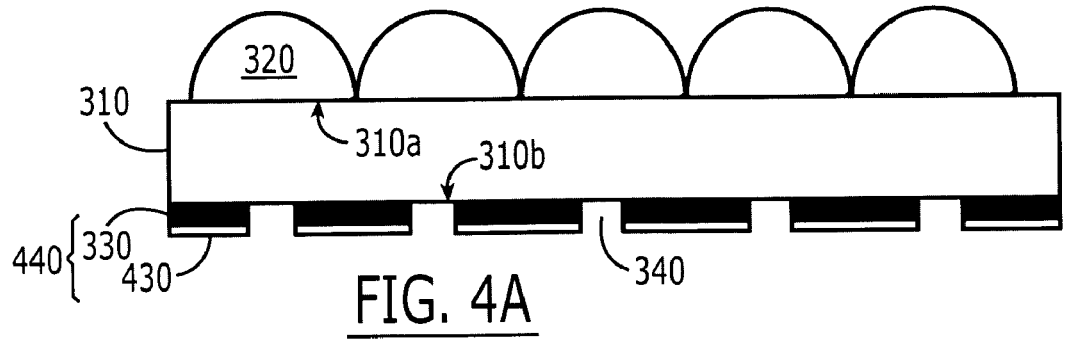
FIGS. 4A and 4B are cross-sectional views of contrast enhancement films according to other embodiments of the present invention from a structural and optical perspective, respectively.
Figure 4B:
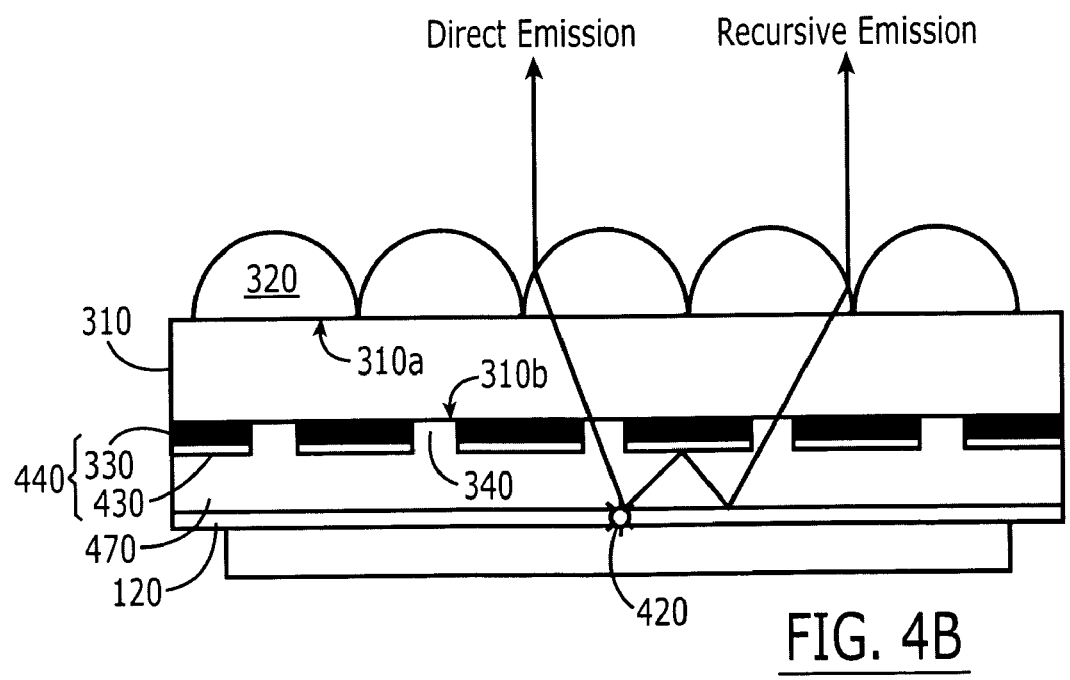

FIGS. 4A and 4B are cross-sectional views of a contrast enhancement film according to other embodiments of the present invention from a structural and an optical perspective, respectively. In these embodiments, the optically blocking layer 440 includes a black layer 330 including the array of apertures 340 therein, and a reflective layer 430, such as an aluminum layer, that also includes the array of apertures 340 therein, on the black layer 330 opposite the substrate 310.

A contrast enhancement film having a structure shown in FIGS. 4A and 4B may be constructed by microreplicating an optical microstructure layer 320 having an array of cylindrical lens-like projections on one side of a 50 μm thick polyester base substrate. The optical microstructure need not be limited to lens-like projections, but may also take many other forms such as prisms and complex polyhedra as well as combinations of shapes. Other substrate materials that could be used include polycarbonate film, acrylic film, acetate film and glass, among others. Individual lens-like projections may be approximately 80 μm in width and about 50 μm in height. The lens-like projections may be replicated from a master using a photopolymer with cured refractive index of about 1.50. The lens-like projections may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087; and/or 6,816,306, the disclosures of which are hereby incorporated herein by reference in their entirety as if set forth fully herein. Other techniques and materials may be used for replicating the microstructures. Some of these include injection molding, embossing, calendaring, thermoplastic and thermoset resins, and room temperature vulcanizing one-part and two-part systems.

The surface 310b opposite the over-layered optical microstructure may be coated with a 4 μm thickness of carbon black 330 in an organic binder. Other light-absorbing layers can be used such as titanium carbide, tantalum nitride, anodized aluminum, and the like. The outer surface of the carbon black layer 330 may be coated with 200 nm of evaporated aluminum 430. Other reflective materials may be used, including silver, chromium, nickel, multilayer dielectric reflection enhancing structures and/or combinations thereof.

The composite carbon black/aluminum layer 440 may be exposed to high-energy laser pulses with a wavelength of about 1.0 μm from a YAG laser source, with the laser impinging on the optical microstructure side (the top of FIG. 4A). The optical microstructures cause localized convergence of laser light in "bright" zones that are in registry with individual optical microstructures. In this example, the bright zones are formed directly beneath one or more lens-like projection(s) by exposing the film from a direction perpendicular to the plane of the film. In other embodiments, the bright zones may be formed at locations that are offset from the lens-like projections by exposing the film from directions other than perpendicular to the plane of the film. In yet other embodiments, multiple exposures from one or more directions, which may or may not include a perpendicular direction, may be used to create multiple bright zones beneath a lens-like projection. Areas between bright zones are "shadow" zones where exposure intensity is much lower than in "bright" zones. The carbon black/aluminum film 440 in the bright zones is ejected due to absorption of laser energy, forming a transmissive aperture 340 corresponding to the bright zone. In some embodiments, the amount of carbon/aluminum ejected from the bright areas may be equivalent to 20% of the total area. Other area fractions could be used, for example, a smaller aperture area (area fraction of carbon/aluminum removed by the laser) may blacken the display with a narrower view angle, while a larger aperture area may provide a less black display with a wider view angle. The apertures may be fabricated as described in U.S. Pat. Nos. 6,967,779 and/or 4,172,219.

As shown in FIG. 4B, the composite film thus exposed is mounted on the surface of a Lambertian-like display 120 with the aperture layer 440 toward the display surface and the optical microstructure layer 320 toward the viewer. The attachment may be provided an adhesive layer 470 between the optically blocking film 440 and the display panel 120, which can also extend into the apertures 340. As shown in FIG. 4B, image light 420 arriving at the contrast enhancement film from the aperture side either directly passes through the aperture and is then relayed toward the viewer by the optical microstructure ("direct emission"), or it is reflected back toward the display by the aluminum layer 430. Light reflected by the aluminum layer 430 may then undergo additional reflections ("recursive emission") within the display, e.g. from the surface of the phosphor layer in the case of a CRT or plasma display, and then redirected once again toward the aluminum aperture layer 430. Following multiple recursive reflections, substantially all of the light may eventually pass through the apertures 340 and on toward the viewer. The efficiency of the film of FIGS. 4A and 4B can be further enhanced by intentionally increasing or maximizing the reflectivity of the underlying display components such as the phosphor materials and/or supporting structure. The film thereby can provide efficient throughput from source to viewer. From the viewing side (top of FIGS. 4A/4B), the carbon black layer 330 can absorb ambient light falling on the film surface and thereby can enhance contrast of the image. The optical microstructures may be designed to provide desired horizontal and vertical viewing angles, in some embodiments.

FIG. 4B illustrates two reflections from the image light 420 of the display 120 through the aperture 340. However, recursive emission according to other embodiments of the present invention may take place one or more times. Moreover, in other embodiments of the present invention, recursive emission of FIG. 4B may be enhanced by modifying the direct-view display panel 120 to provide a reflective outer surface thereof. Typically, in order to reduce glare and/or improve contrast, the surface of a direct-view display panel may be provided with a light-absorbing layer. However, in order to enhance recursive emission according to some embodiments of the present invention, the outer surface of the direct-view display panel 120 may be made reflective.

Figure 4C:
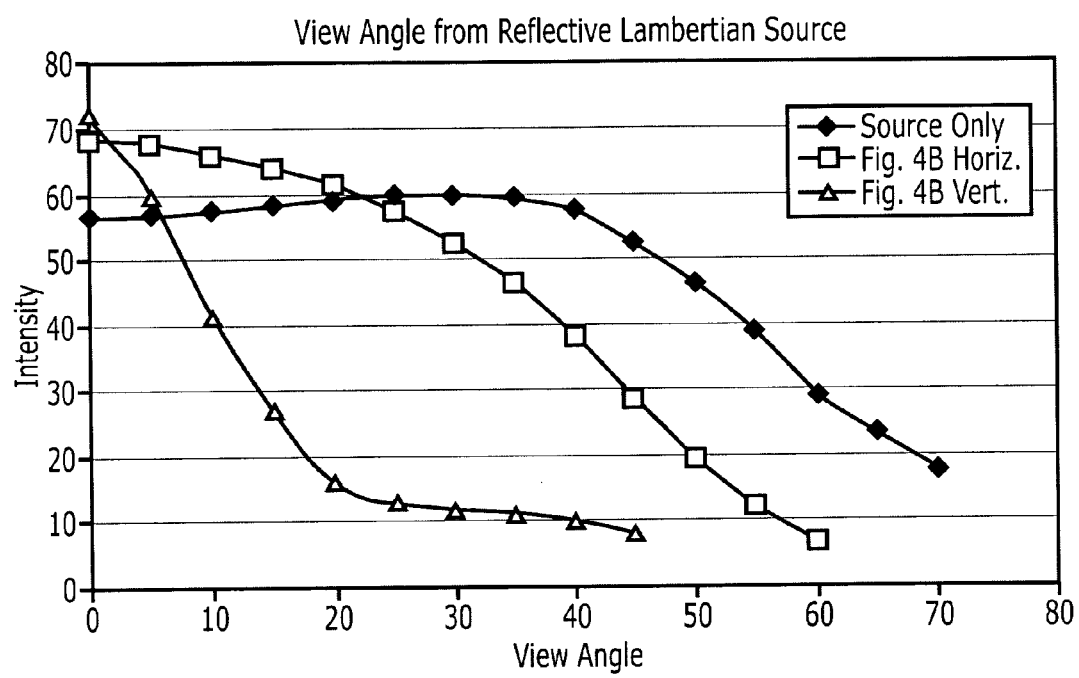
FIG. 4C graphically illustrates intensity as a function of view angle for embodiments of FIGS. 4A and 4B.

As shown in FIG. 4C, the contrast enhancement film of FIG. 4B can produce efficient transfer of light to the viewer, particularly through the horizontal viewing range, generally the most important consideration for a television display. As shown in FIG. 4C, the film produces on-axis gain, which means the display is actually brighter to a viewer seated in front of the display that it otherwise would be without the film installed. This gain is produced at the expense of vertical view angle, due to the collimating property of the lens-like optical microstructures.

Embodiments of contrast enhancement films of FIGS. 4A/4B can have a potential advantage of easier mounting, since the aperture side is attached to the display surface rather than the optical microstructure side. This mounting may avoid the need to index-match the optical microstructure. Embodiments of FIGS. 4A and 4B may also provide more contrast benefit, since the film can still be effective even with a high coverage of black. This is because the construction of FIGS. 4A and 4B need not be constrained by the acceptance angle of the lens/aperture combination.

Embodiments of FIGS. 4A and 4B (and/or other embodiments herein) can serve the dual purpose of acting as an RFI/EMI shield for the display, due to the high conductivity of the aluminum layer 430. This permits consolidation of RFI/EMI shielding into the contrast enhancement film, which can reduce cost and simplify construction. Current approaches to RFI/EMI shielding in plasma televisions may use an additional discrete layer. Moreover, in other embodiments, the aluminum layer 430 may be patterned to allow the reflective layer 430 to carry electric signals that are used to operate the direct-view display panel 120. For example, pixel activating signals may be carried. One or more additional patterned conductive layers comprising transparent conductors, such as indium tin oxide, also may be provided between the substrate 310 and the display panel 120, to carry additional signaling. Thus, row and column signals may be carried by the reflective layer 430 and an orthogonally extending transparent conductive layer, in some embodiments.

Figure 9A:
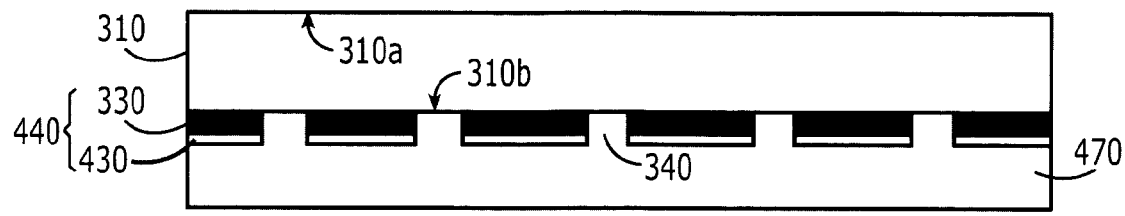
Figure 9B:
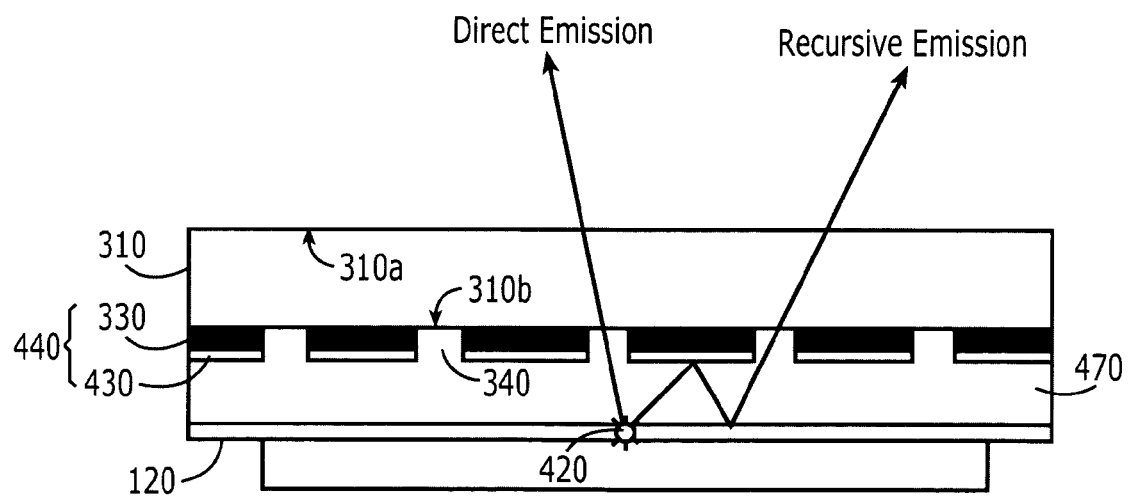

As shown in FIGS. 9A and 9B, in other embodiments, the optical microstructure layer of FIGS. 4A/4B need not be provided. Rather, the contrast enhancement film of these embodiments may be provided via the composite black 330/reflective 430 layer, including apertures therein 340, as illustrated in FIGS. 9A/9B. By eliminating the optical microstructure layer 320 of FIGS. 4A/4B, a potentially lower cost alternative may be provided, albeit at potentially lower performance.

Figure 5A:
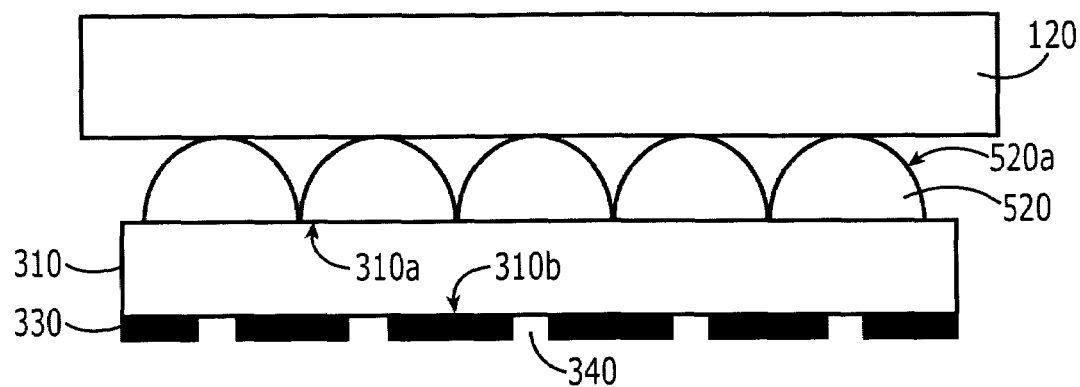
FIGS. 5A-5B, 6A-6B, 7A-7B, 8A-8B and 9A-9B are cross-sectional views of contrast enhancement films according to still other embodiments of the present invention from structural and optical perspectives, respectively.
Figure 5B:
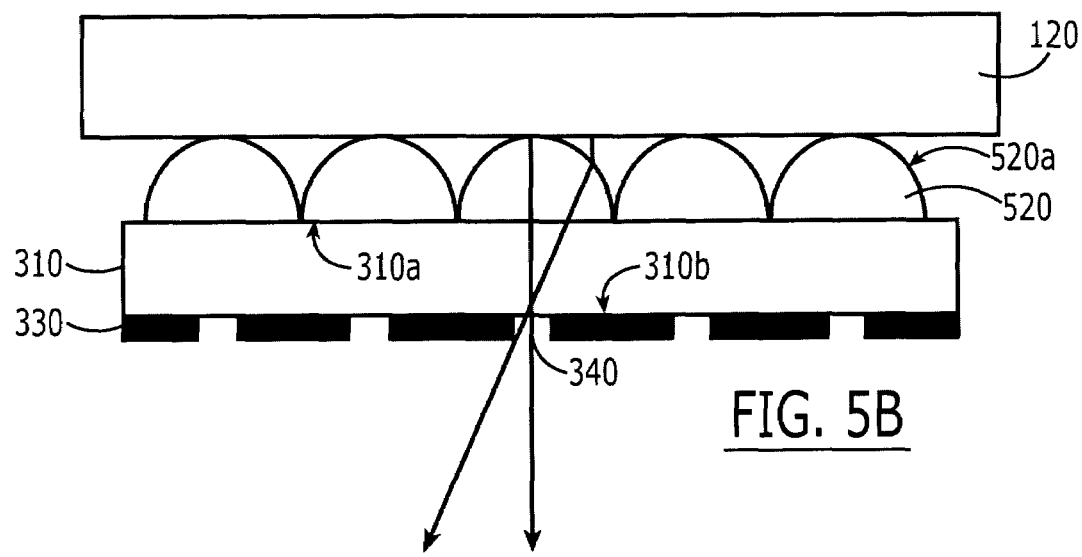

FIGS. 5A and 5B are cross-sectional views of other embodiments of the present invention from a structural and optical perspective, respectively. In these embodiments, the optical microstructures 520 include an adhesive surface 520a that is configured to mount the contrast enhancement film on the direct-view display panel 120, to extend between the direct-view display panel 120 and the outer panel. In other respects, the optical microstructures 520 can be similar to the optical microstructures 320 described above.

A contrast enhancement film as shown in FIGS. 5A and 5B may be prepared by microreplicating an optical microstructure layer 520 on one side 310a of a transparent polyester film 310 with thickness of 50 μm. Other substrate materials that could be used include polycarbonate film, acrylic film, acetate film and glass, among others. The lens-like projections may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087 and/or 6,816,306, the disclosures of which are hereby incorporated herein by reference in their entirety as if set forth fully herein. Other techniques and materials may be used for replicating the microstructures 520. Some of these include injection molding, embossing, calendaring, thermoplastic and thermoset resins, and room temperature vulcanizing one-part and two-part systems.

The photopolymer chosen for the microstructures 520 may be of a type typically used for the formation of Pressure-Sensitive Adhesives (PSA), wherein the cured or partially cured polymer retains adhesive "tack" and can thereby create adhesion between two substrates in which one or both substrates has been coated with a PSA layer. The surface 310*b* opposite the optical microstructure may be coated with a 4 μm thickness of carbon black 330 in an organic binder. Other light-absorbing layers can be used such as titanium carbide, tantalum nitride, anodized aluminum, and/or the like. The carbon black layer may be exposed to high-energy laser pulses with a wavelength of about 1.0 μm from a YAG laser source, with the laser impinging on the optical microstructure side. The optical microstructures cause localized convergence of laser light in "bright" zones that are in registry with individual optical microstructures. Areas between bright zones are "shadow" zones where exposure intensity it much lower than in "bright" zones. The carbon film in the bright zones is ejected due to absorption of laser energy, forming a transmissive aperture corresponding to the bright zone. The apertures may be fabricated as described in U.S. Pat. Nos. 6,967,779 and/or 4,172,219. The contrast enhancement film thus produced is then adhesively mounted on the surface of a Lambertian-like display 120 by laminating the film to the surface, with the optical microstructures 520 toward the display 120. Adhesive tack in the optical microstructures 520 creates adhesion between the contrast enhancement film and the display surface.

Attachment of the film through the upper-most surface 520*a* ("tips") of the projecting optical microstructures 520 allows adhesive bonding to be achieved without the need to fill in the spaces around the optical microstructures. This in turn leaves an air gap in the areas of the optical microstructures, creating the desired optical refraction.

Contrast enhancement films of FIGS. 5A/5B may have a potential advantage of ease of mounting, and may provide enhanced display viewability due to potentially better ambient light absorption and contrast.

Figure 6A:
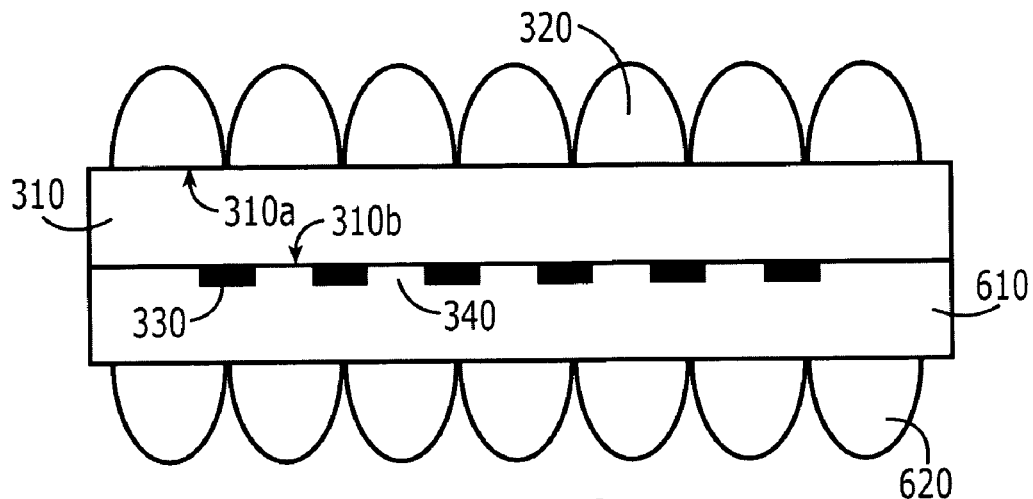
Figure 6B:
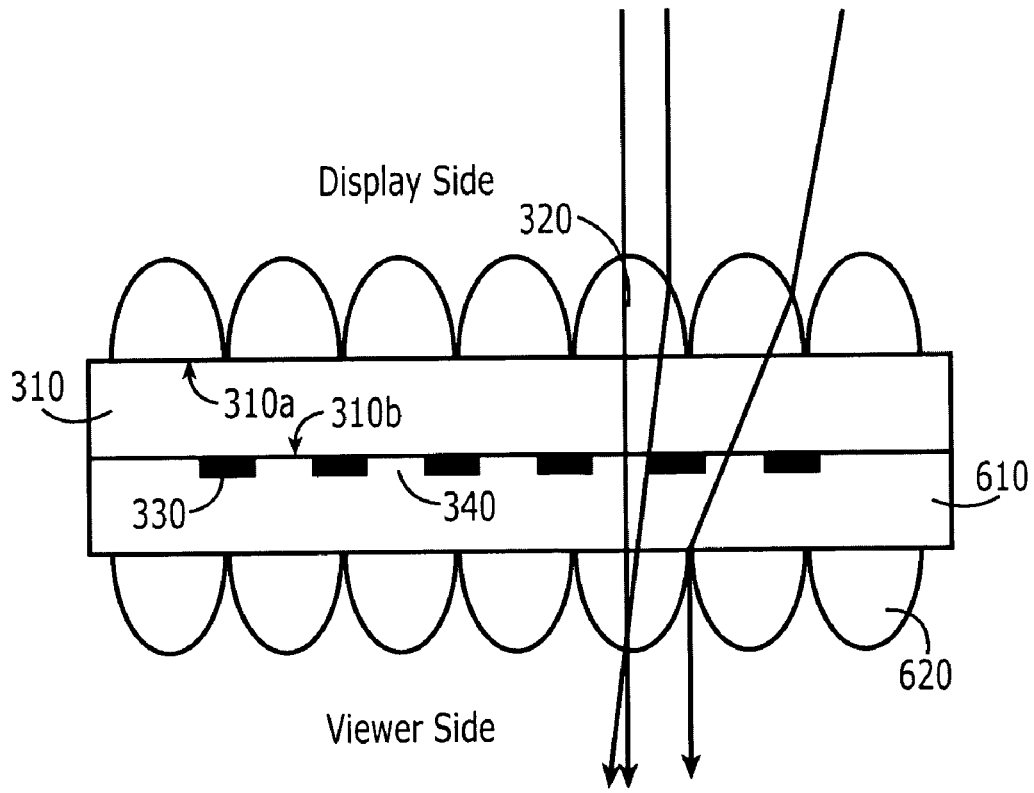

FIGS. 6A and 6B are cross-sectional views of contrast enhancement films according to still other embodiments of the present invention from a structural and optical perspective, respectively.

A contrast enhancement film as shown in FIGS. 6A/6B may be prepared by microreplicating an optical microstructure layer 320 on one side 310*a* of a first sheet 310 of 50 μm transparent polyester having a 4 μm thick carbon black light absorbing layer 330 on the opposite surface 310*b*. The lens-like projections may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087 and/or 6,816,306, the disclosures of which are hereby incorporated herein by reference in their entirety as if set forth fully herein. Other substrate materials that could be used include polycarbonate film, acrylic film, acetate film and glass, among others. Other techniques and materials may be used for replicating the microstructures. Some of these include injection molding, embossing, calendaring, thermoplastic and thermoset resins, and room temperature vulcanizing one-part and two-part systems. Other light absorbing layers 330 can be used such as titanium carbide, tantalum nitride, anodized aluminum, and/or the like.

The carbon black layer 330 may be exposed to high-energy laser pulses with a wavelength of about 1.0 μm from a YAG laser source, with the laser impinging on the optical microstructure side. The optical microstructures cause localized convergence of laser light in "bright" zones that are in registry with individual optical microstructures. Areas between bright zones are "shadow" zones where exposure intensity is much lower than in "bright" zones. The carbon film in the bright zones is ejected due to absorption of laser energy, forming a transmissive aperture corresponding to the bright zone. The apertures 340 may be fabricated as described in U.S. Pat. Nos. 6,967,779 and/or 4,172,219.

A second substrate or sheet 610 may be prepared by microreplicating optical microstructures 620 identical to the first microstructures 320 on one side of a 50 μm thick transparent polyester sheet 610. The first sheet 310 is adhesively attached to the second sheet 610 with the optical microstructure layers 320, 620 of the first and second sheets facing outwards, and the carbon layer 330 sandwiched between the sheets. The attachment of the first and second sheets may be done in a manner that results in alignment of optical microstructures on the first sheet with optical microstructures on the second sheet.

The resulting film can produce both contrast enhancement and collimation of image light from a Lambertian source. The film is bidirectional, i.e. either side may face the display.

Figure 7A:
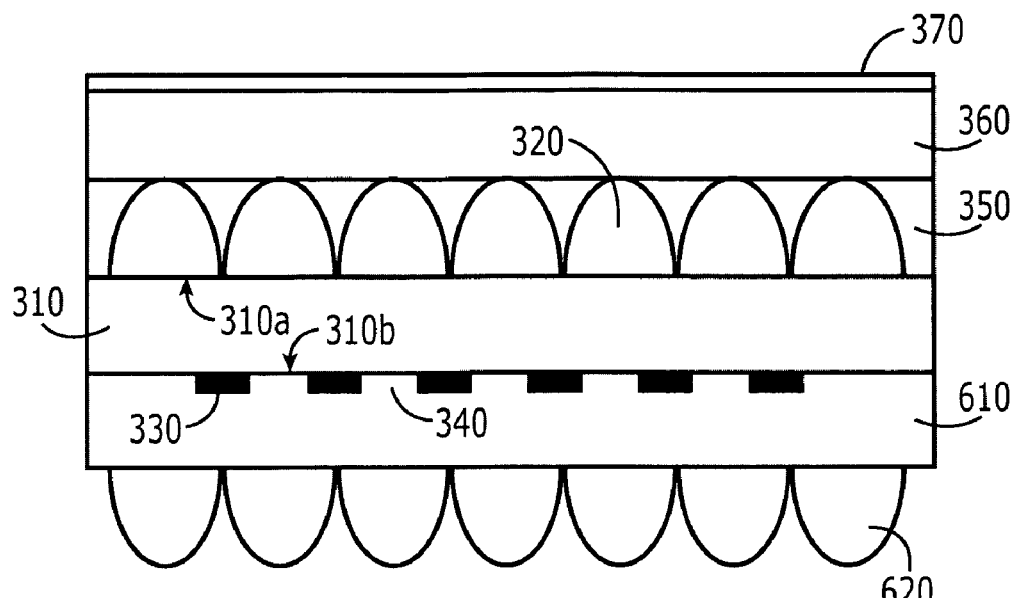
Figure 7B:
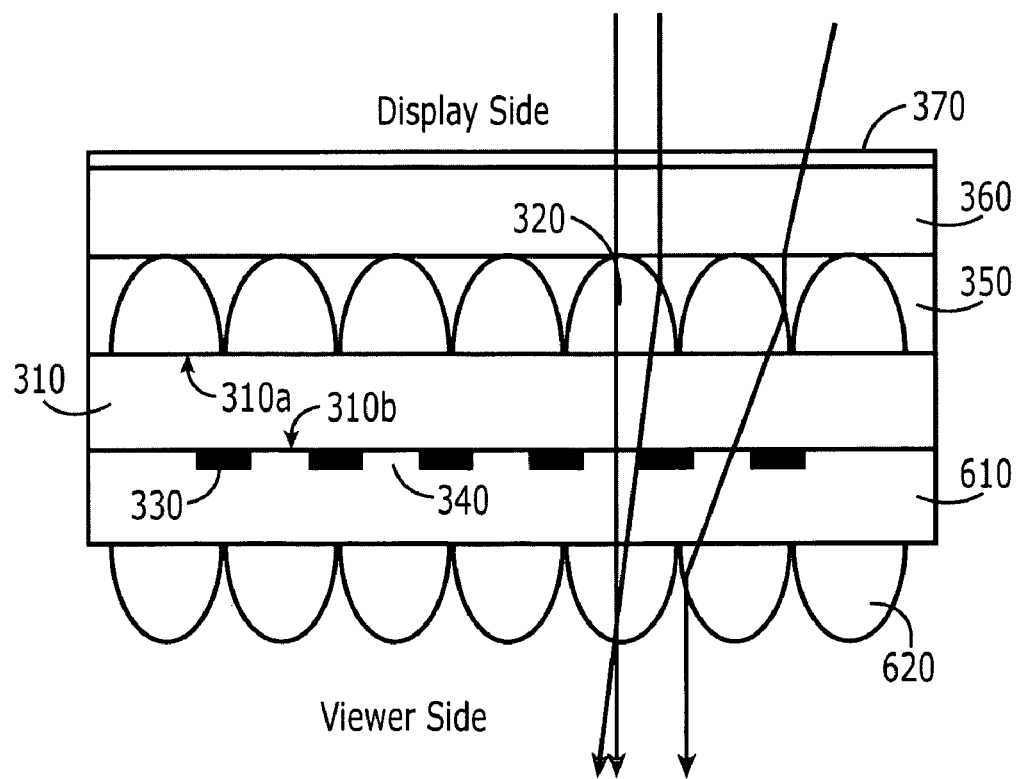

FIGS. 7A and 7B are cross-sectional views of still other contrast enhancement films according to still other embodiments of the present invention, from a structural and optical perspective, respectively.

A contrast enhancement film as shown in FIGS. 7A/7B may be prepared by microreplicating an optical microstructure layer 320 with index of 1.5 on one side of a first sheet 310 of 50 μm transparent polyester having a 4 μm thick carbon black light absorbing layer 330 on the opposite surface. The lens-like projections 320 may be fabricated as described in published U.S. Patent Application Nos. 2005/0058947; 2005/0058948; 2005/0058949 and/or 2003/00206342; and/or U.S. Pat. Nos. 6,967,779; 6,788,460; 6,829,087 and/or 6,816,306, the disclosures of which are hereby incorporated herein by reference in their entirety as if set forth fully herein. Other substrate materials that could be used include polycarbonate film, acrylic film, acetate film and glass, among others. Other light absorbing layers 330 can be used such as titanium carbide, tantalum nitride, anodized aluminum, and/or the like.

This optical microstructure layer may be over-layered with a planar cladding layer 350 having a refractive index of about 1.4 by flowing a room temperature-vulcanizing silicone composition between the optical microstructure layer and a planar sheet of polyester having a thickness of about 175 μm followed by curing at room temperature. Other cladding materials that may be used include higher index polymers such as polystyrene, novolak resin, polyhydroxystyrene, polycarbonates and polysulfones; and lower refractive index materials such as various siloxane-containing polymers and fluoro- and perfluoroacrylate polymers and copolymers.

The carbon black layer 330 may be exposed to high-energy laser pulses with a wavelength of 1.0 μm from a YAG laser source, with the laser impinging on the optical microstructure side. The optical microstructures cause localized convergence of laser light in "bright" zones that are in registry with individual optical microstructures. Areas between bright zones are "shadow" zones where exposure intensity it much lower than in "bright" zones. The carbon film in the bright zones is ejected due to absorption of laser energy, forming a transmissive aperture 340 corresponding to the bright zone. The apertures may be fabricated as described in U.S. Pat. Nos. 6,967,779 and/or 4,172,219.

A second sheet 610 may be prepared by microreplicating optical microstructures 620 identical to that of the first microstructures 360 on one side of a 50 μm thick transparent polyester sheet 610. Other substrate materials that could be used include polycarbonate film, acrylic film, and acetate film and glass, among others. The first sheet 310 may be adhesively attached to the second sheet 610 with the optical microstructure layers 320, 620 facing outwards, and the carbon layer 330 sandwiched between the sheets. A conventional transparent photopolymerizable adhesive 370 may be used for attachment of the sheets. Any transparent adhesive may be suitable. The attachment of the first and second sheets may be done in a manner that results in alignment of optical microstructures on the first sheet with optical microstructures on the second sheet.

The film thus produced may be adhesively mounted on the surface of a Lambertian-like display using a transparent adhesive 370, with the cladding layer 350 facing the display. The film can produce an enhancement of contrast and partial collimation of display light toward the viewer.

Figure 8A:
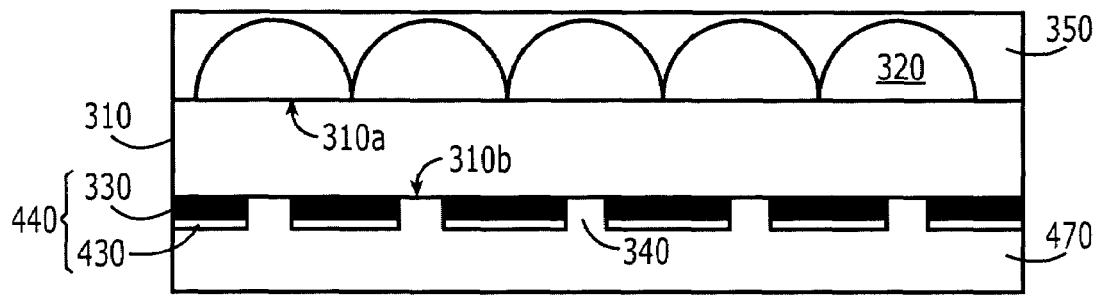
Figure 8B:
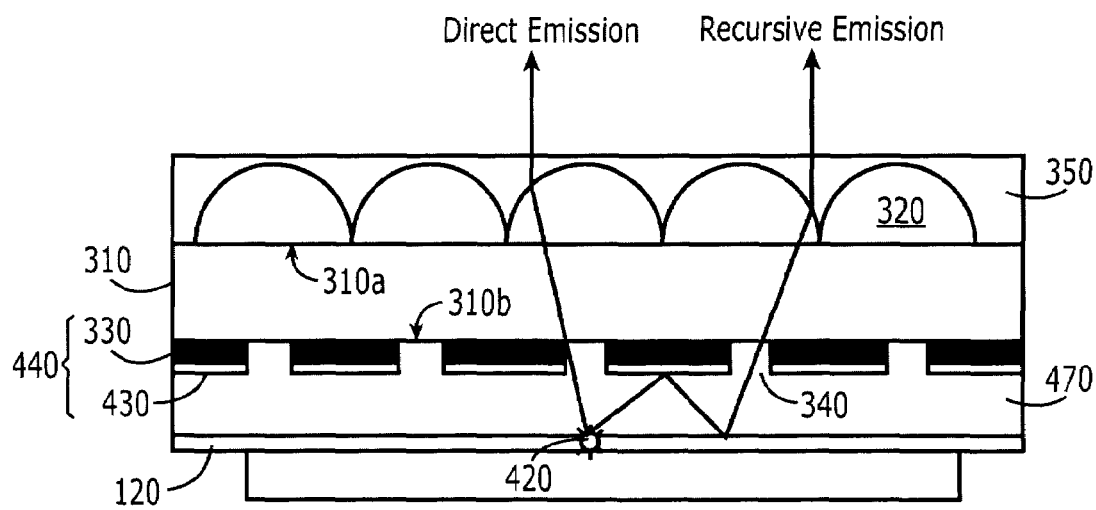

FIGS. 8A and 8B are cross-sectional views of contrast enhancement films according to still other embodiments of the present invention from a structural and optical perspective, respectively. Embodiments of FIGS. 8A and 8B correspond to embodiments of FIGS. 4A and 4B, except that a cladding layer 350 is added. Accordingly, a repetition of the description will not be provided for the sake of brevity.

Figure 10A:
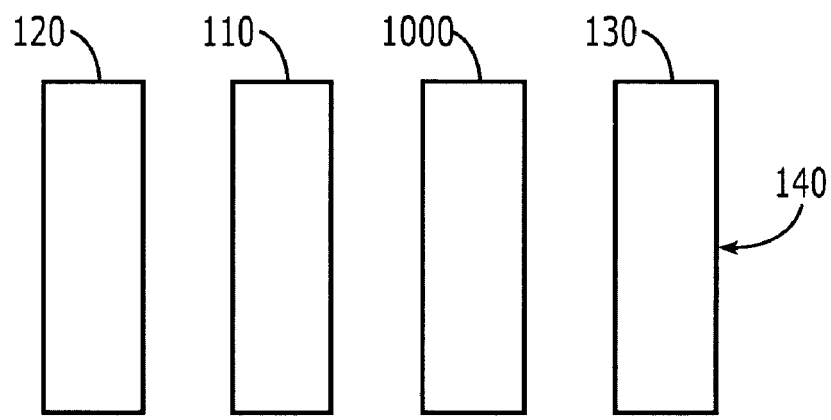
FIGS. 10A and 10B are cross-sectional views of direct-view displays including EMI shields and/or contrast enhancement films according to some embodiments of the present invention.

Embodiments of the invention that combine contrast enhancement films and EMI shields will now be further described. In particular, referring to FIG. 10A, a cross-sectional view of a direct-view display including a direct-view display panel 120 and an outer panel 130 that defines an outer surface 140 for the direct-view display is shown. As also shown in FIG. 10A, an EMI shield 110 and a contrast enhancement film 1000, that are configured according to any of the embodiments of the invention described herein, are placed between the direct-view display panel 120 and the outer surface 130. The EMI shield 110 may be embodied according to any of the embodiments of FIGS. 2A-2C and/or of any of the other embodiments of EMI shields described herein. Moreover, the contrast enhancement film 1000 may be embodied according to any of the embodiments of FIGS. 3A-9B and/or any of the other embodiments described herein. The placement of the EMI shield 110 and the contrast enhancement film 1000 may be reversed from that shown herein, such that the contrast enhancement film 1000 is closer to the direct-view display panel 120 than the EMI shield 110. A specific embodiment of FIG. 10A will be described below in connection with FIG. 11A.

Figure 10B:
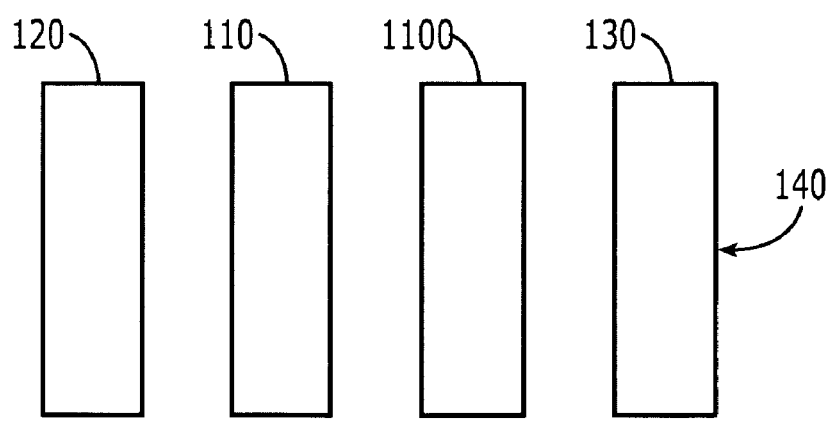

FIG. 10B illustrates other embodiments of the present invention, wherein an EMI shield 110, according to any of the embodiments described herein, and a conventional EMI shield 1100, are placed between the direct-view display panel 120 and the outer panel 130. As with FIG. 10A, the order of placement may be reversed, such that the conventional EMI shield 1100 is closer to the direct-view display panel 120 than the EMI shield 110 according to embodiments of the invention. As was already described herein, a conventional EMI shield includes a conductive mesh having an array of gaps therein, wherein conductive mesh is configured to shield at least some of the EMI that is emitted by the direct-view display panel 120. However, the conventional EMI shield 1100 is free of an optical redirecting structure, as was described previously herein. For ease of description, EMI shields according to embodiments of the invention may be referred to as "optical EMI shields" 110, due to the use of an optical redirecting structure, such as a microlens array.

When a conventional EMI shield 1100 is used in combination with an optical EMI shield 110, the conductive meshes of the conventional EMI shield 1100 and of the optical EMI shield 110 may have different fill factors (i.e., may include different ratios of gap area to mesh area). Moreover, in some embodiments, the conventional EMI shield 1100 may have a larger ratio of gap area to mesh area (i.e., reduced fill factor) compared to conventional EMI shields that are not used in combination with optical EMI shields 110, because the optical EMI shield 110 can provide a portion of the EMI shielding, which can reduce the EMI shielding requirements on the conventional EMI shield 1100. Specific embodiments of FIG. 10B will be described in connection with FIG. 11B below.

Finally, it will be understood by those having skill in the art that embodiments of FIGS. 10A and 10B may be combined, for example, by providing an optical EMI shield 110, a contrast enhancement film 1000 according to embodiments of the invention, and a conventional EMI shield 1100 between the direct-view display panel 120 and the outer panel 130. These three elements may be arranged in any desired order relative to the direct-view display panel 120 and the outer panel 130.

Figure 11A:
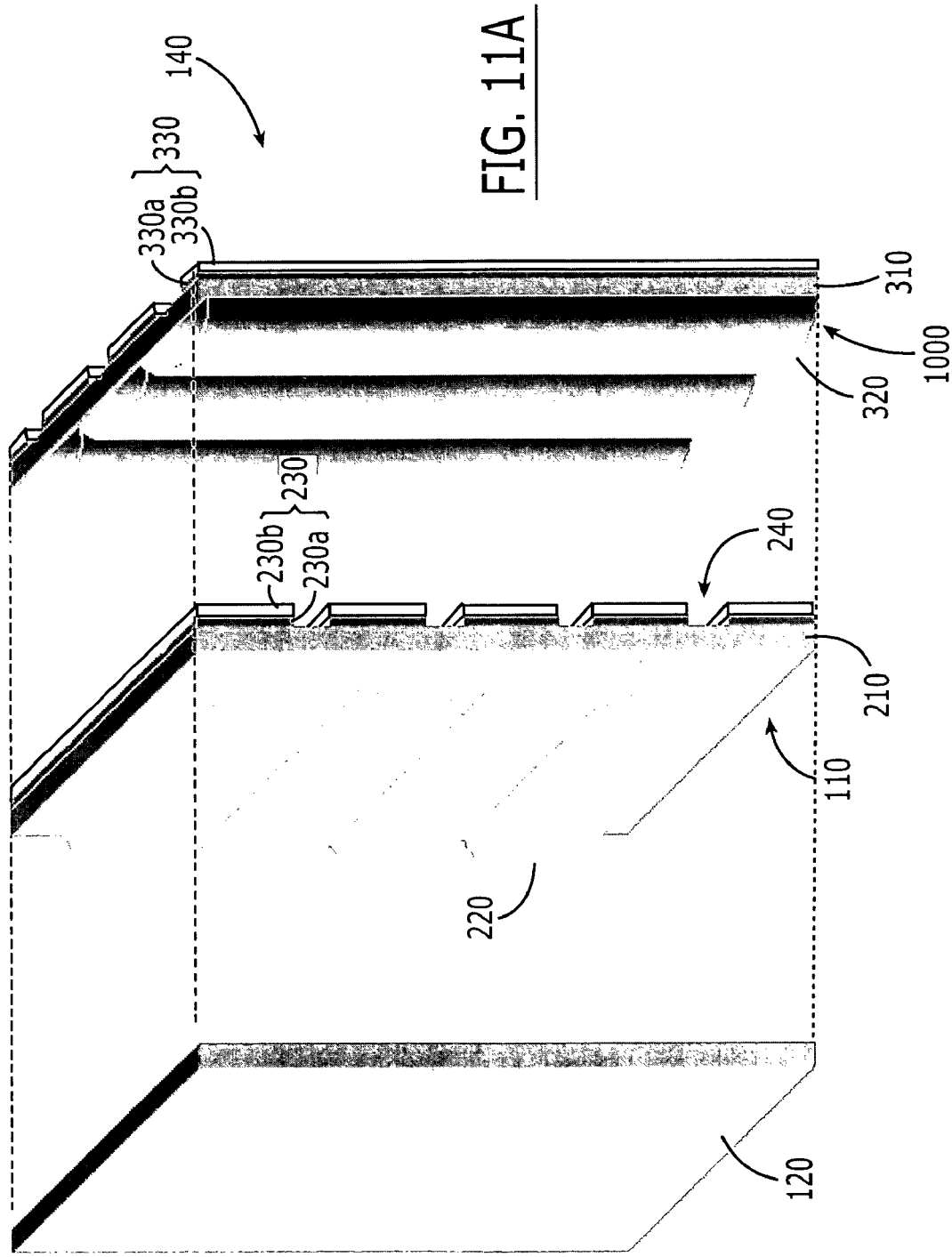
FIGS. 11A and 11B are perspective views of direct-view displays including EMI shields and/or contrast enhancement films according to specific embodiments of FIGS. 10A and 10B, respectively.

FIG. 11A is an exploded perspective view of specific embodiments of FIG. 10A. Specifically, referring to FIG. 11A, an optical EMI shield 110 and a contrast enhancement film 1000 are provided. In these embodiments, the optical EMI shield 110 includes a substrate 210 and an array of optical microstructures 220 that provides an optical redirecting structure. As shown in FIG. 11A, in these embodiments, the array of optical microstructures 220 comprises horizontally oriented lenticular microlenses. As also shown in FIG. 11A, the second face of the substrate includes a conductive mesh 230, including an array of gaps 240 therein. In embodiments of FIG. 11A, the conductive mesh comprises an array of horizontally oriented conductor stripes.

Moreover, in some embodiments of the invention, a multilayer conductive mesh 230 is provided including a base conductor layer 230a and an overlayer conductor layer 230b. Multilayers may be provided, according to some embodiments of the present invention, in order to provide a sufficiently thick conductor to provide a desired EMI shielding. More specifically, in forming a conductive mesh 230 according to some embodiments of the invention using fabrication techniques described above, a relatively thin conductive layer of, for example, copper and/or nickel, may be formed at a thickness of, for example, less than about 1000 Å. In order to provide a sufficiently thick layer to provide a desired EMI shielding, such as a layer of up to 3000 Å or more in thickness, an overlayer 230b comprising, for example, copper, may be formed on the base conductor layer 230a. The overlayer 230b may be formed, for example, by plating the conductor overlayer on the base conductor layer 230a. Thicker conductive meshes 230 may thereby be provided to increase the EMI shielding. It will also be understood by those having skill in the art that multilayer conductive meshes 230 may be used with any embodiments of EMI shields that are described herein.

Still continuing with the description of FIG. 11A, a contrast enhancement film 1000 also is provided according to embodiments of the invention. The contrast enhancement film may include a substrate 310 and an array of optical microstructures 320, such as a vertically oriented array of lenticular microlenses. A vertically oriented optically blocking and conductive film 330 may also be provided. The optically blocking and conductive film may include a base layer 330a and an overlayer 330b, which may be similar to the base layer 230a and overlayer 230b of the EMI shielding film. A black layer also may be included according to any of the embodiments described herein, and, in some embodiments, when the overlayer 330b is the outer layer, the overlayer 330b is a black layer.

It will also be understood by those having skill in the art that, in embodiments of FIG. 11A, the designation of "EMI shield" and "contrast enhancement film" may be somewhat arbitrary, because both structures 110 and 1000 can provide EMI shielding and contrast enhancement functionality.

Moreover, the combined fill factor of the two structures 110 and 1000 may be less than a fill factor of a conventional EMI shield, so that an enhanced brightness may be provided.

Figure 11B:
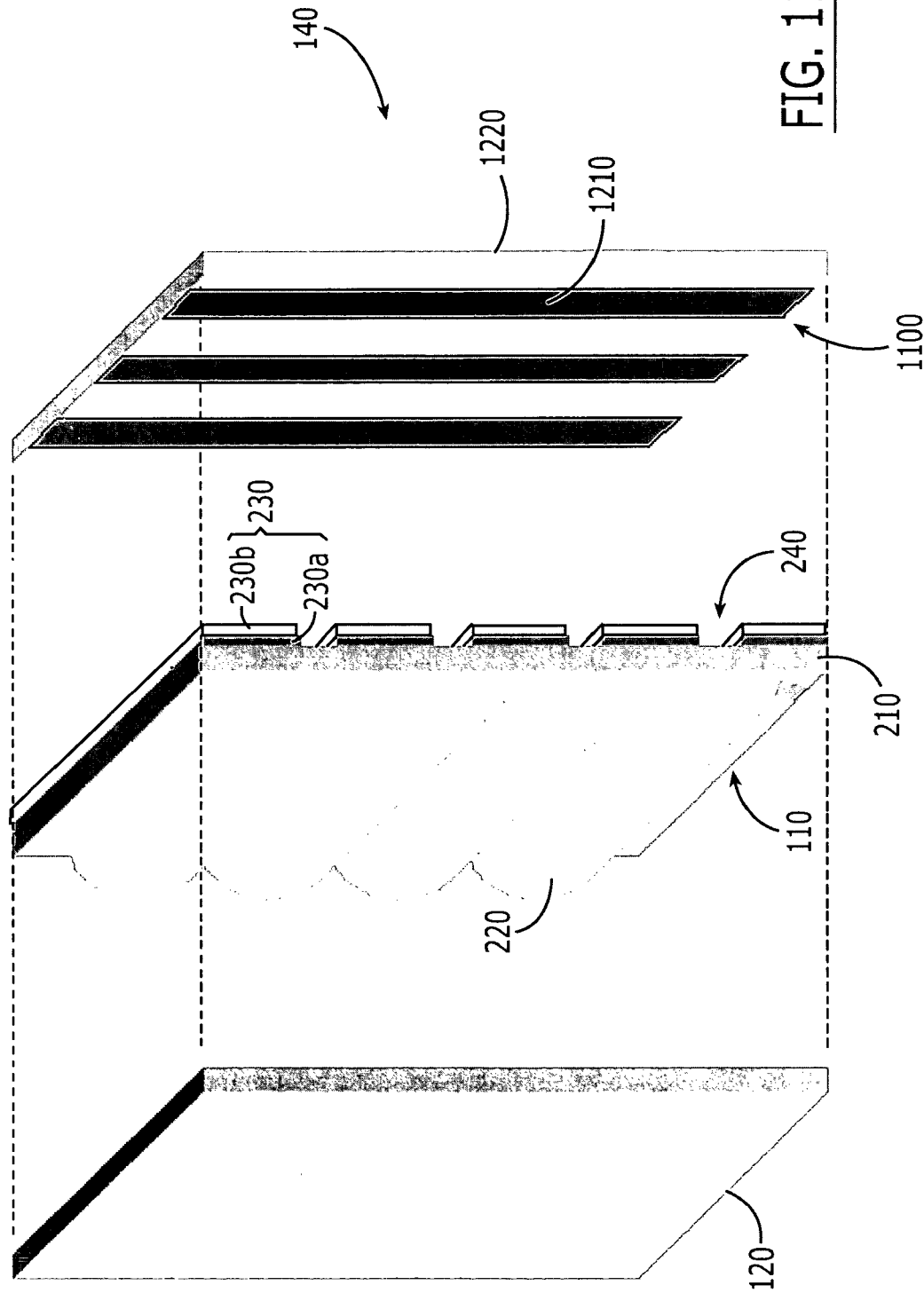

FIG. 11B is an exploded perspective view of specific embodiments of FIG. 10B. In FIG. 11B, an optical EMI shield 110 corresponding to FIG. 11A is used in combination with a conventional EMI shield 1100 that includes a conductive mesh 1210 on a substrate 220, but does not include (i.e., is free of) an optically redirecting structure, such as an array of optical microstructures. In embodiments of FIG. 11B, the conventional EMI shield conductive mesh 1210 may be embodied as an array of vertically oriented conductor stripes, which has a much lower fill factor (a much larger area of gaps to mesh area) than a conventional EMI shield that is not used in combination with optical EMI shields 110 according to embodiments of the invention. In particular, since the conventional EMI shield 1100 does not include any horizontally oriented conductors, a much reduced fill factor is provided, which can provide greater light transmission.

It will also be understood that embodiments of FIGS. 11A and 11B, including the horizontally- and vertically-extending lenses and conductor patterns, and/or the multilayer conductor patterns, may be used with any of the embodiments of the present invention that were described previously herein.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An Electromagnetic Interference (EMI) shield and contrast enhancement film for a direct-view display having a direct-view display panel and an outer panel that provides an outer surface for the direct-view display;
   the EMI shield comprising:
   a conductive mesh including an array of gaps therein, the conductive mesh configured to shield at least some of the EMI that is emitted by the direct-view display panel; and
   an optical redirecting structure that is configured to redirect at least some optical radiation that is emitted from the direct-view display panel that would strike the conductive mesh, through the gaps in the conductive mesh;
   the EMI shield being configured to mount between the direct-view display panel and the outer panel such that the optical redirecting structure is adjacent the direct-view display panel and the conductive mesh is remote from the direct-view display panel; and
   the contrast enhancement film comprising:
   a substrate having first and second opposing sides;
   an array of optical microstructures on the first side of the substrate; and
   an optically blocking film including an array of apertures therein on the second side of the substrate, the contrast enhancement film being configured to mount between the direct-view display panel and the outer panel.

2. An EMI shield and contrast enhancement film according to claim 1 wherein the optical redirecting structure comprises an array of optical microstructures.

3. An EMI shield and contrast enhancement film according to claim 2 wherein the array of optical microstructures defines a nonplanar surface, the EMI shield further comprising:
   a cladding layer on the nonplanar surface of the optical microstructures, the cladding layer including a planar surface opposite the nonplanar surface of the optical microstructures.

4. An EMI shield and contrast enhancement film according to claim 3 wherein the cladding layer has different index of refraction than the optical microstructures.

5. An EMI shield and contrast enhancement film according to claim 3 further comprising:
   a substrate having first and second opposing sides, wherein the array of optical microstructures is on the first side of the substrate and wherein the conductive mesh is on the second side of the substrate;
   a bonding substrate on the cladding layer opposite the substrate; and
   an adhesive layer on the bonding substrate that is configured to mount the EMI shield between the direct-view display panel and the outer panel.

6. An EMI shield and contrast enhancement film according to claim 2 further comprising:
   a substrate having first and second opposing sides;
   wherein the array of optical microstructures is on the first side of the substrate; and
   wherein the conductive mesh is on the second side of the substrate.

7. An EMI shield and contrast enhancement film according to claim 6 further comprising:
   a bonding substrate on the array of optical microstructures opposite the substrate; and
   an adhesive layer on the bonding substrate that is configured to mount the EMI shield between the direct-view display panel and the outer panel.

8. An EMI shield and contrast enhancement film according to claim 2 wherein the array of optical microstructures includes an adhesive surface that is configured to mount the EMI shield between the direct-view display panel and the outer panel.

9. An EMI shield and contrast enhancement film according to claim 1 further comprising an adhesive layer that is configured to mount the EMI shield and contrast enhancement film between the direct-view display panel and the outer panel.

10. An EMI shield and contrast enhancement film according to claim 1 wherein the direct-view display panel is a plasma or cathode ray tube display panel.

11. An EMI shield and contrast enhancement film according to claim 1 in combination with the direct-view display panel and the outer panel that provides an outer surface for the direct-view display, wherein the EMI shield and contrast enhancement film are mounted between the direct-view display panel and the outer panel.

12. An EMI shield and contrast enhancement film according to claim 1 wherein the conductive mesh includes a different ratio of gap area to mesh area than a ratio of aperture area to optically blocking film area in the contrast enhancement film.

13. An EMI shield and contrast enhancement film according to claim 1 wherein the conductive mesh includes a larger ratio of gap area to mesh area than a ratio of aperture area to optically blocking film area in the contrast enhancement film.

14. An EMI shield and contrast enhancement film according to claim 1 wherein the EMI shield is on the direct-view display panel and wherein the contrast enhancement film is on the EMI shield remote from the direct-view display panel.

15. An EMI shield and contrast enhancement film according to claim 1 wherein the contrast enhancement film is on the direct-view display panel and wherein the EMI shield is on the contrast enhancement film remote from the direct-view display panel.

16. An EMI shield and contrast enhancement film according to claim 1 wherein the optically blocking film comprises an electrically conductive film.

17. An EMI shield and contrast enhancement film according to claim 16 wherein the one of the conductive mesh or the electrically conductive film consists of an array of horizontally oriented conductors and the other of the conductive mesh or the electrically conductive film consists of an array of vertically oriented conductors.

18. An EMI shield and contrast enhancement film according to claim 17 wherein the array of horizontally oriented conductors and/or the array of vertically oriented conductors comprise an array of multilayer conductors including a base conductor layer and an overlayer conductor layer.

19. An EMI shield and contrast enhancement film according to claim 18 wherein the base conductor layer is a plating base conductor layer and wherein the overlayer conductor layer is a plated conductor overlayer.

20. An EMI shield and contrast enhancement film according to claim 1 wherein the conductive mesh consists of an array of horizontally oriented conductors or an array of vertically oriented conductors.

21. An EMI shield and contrast enhancement film according to claim 1 wherein the conductive mesh comprises a base conductive layer and an overlayer conductive layer.

22. An EMI shield and contrast enhancement film according to claim 21 wherein the base conductive layer is a plating base conductive layer and wherein the overlayer conductive layer is a plated conductive overlayer.

23. An Electromagnetic Interference (EMI) shield for a direct-view display having a direct-view display panel and an outer panel that provides an outer surface for the direct-view display, the EMI shield comprising a first EMI shield and a second EMI shield,
the first EMI shield comprising:
a first conductive mesh including a first array of gaps therein, the first conductive mesh configured to shield at least some of the EMI that is emitted by the direct-view display panel; and
an optical redirecting structure that is configured to redirect at least some optical radiation that is emitted from the direct-view display panel that would strike the first conductive mesh, through the first array of gaps in the conductive mesh;
the first EMI shield being configured to mount between the direct-view display panel and the outer panel such that the optical redirecting structure is adjacent the direct-view display panel and the first conductive mesh is remote from the direct-view display panel;
the second EMI shield comprising:
a second conductive mesh including a second array of gaps therein, the second conductive mesh configured to shield at least some of the EMI that is emitted by the direct-view display panel; and
the second EMI shield being free of an optical redirecting structure that is configured redirect at least some optical radiation that is emitted from the direct-view display panel that would strike the second conductive mesh, through the second array of gaps in the second conductive mesh.

24. An EMI shield according to claim 23 wherein the first and second conductive meshes include different ratios of gap area to mesh area.

25. An EMI shield according to claim 23 wherein the one of the first conductive mesh or the second conductive mesh consists of an array of horizontally oriented conductors and the other of the first conductive mesh or the second conductive mesh consists of an array of vertically oriented conductors.

26. An EMI shield according to claim 23 wherein the first and/or second conductive mesh comprises a base conductive layer and an overlayer conductive layer.

27. An EMI shield according to claim 26 wherein the base conductive layer is a plating base conductive layer and wherein the overlayer conductive layer is a plated conductive overlayer.

28. An EMI shield according to claim 23 wherein the optical redirecting structure comprises an array of optical microstructures.

29. An EMI shield according to claim 28 wherein the array of optical microstructures defines a nonplanar surface, the EMI shield further comprising:
a cladding layer on the nonplanar surface of the optical microstructures, the cladding layer including a planar surface opposite the nonplanar surface of the optical microstructures.

30. An EMI shield according to claim 29 wherein the cladding layer has different index of refraction than the optical micro structures.

31. An EMI shield according to claim 28 further comprising:
a substrate having first and second opposing sides;
wherein the array of optical microstructures is on the first side of the substrate; and
wherein the first conductive mesh is on the second side of the substrate.

32. An EMI shield according to claim 31 further comprising:
a bonding substrate on the array of optical microstructures opposite the substrate; and
an adhesive layer on the bonding substrate that is configured to mount the first EMI shield between the direct-view display panel and the outer panel.

33. An EMI shield according to claim 29 further comprising:
a substrate having first and second opposing sides, wherein the array of optical microstructures is on the first side of the substrate and wherein the first conductive mesh is on the second side of the substrate;
a bonding substrate on the cladding layer opposite the substrate; and
an adhesive layer on the bonding substrate that is configured to mount the first EMI shield between the direct-view display panel and the outer panel.

34. An EMI shield according to claim 28 wherein the array of optical microstructures includes an adhesive surface that is configured to mount the first EMI shield between the direct-view display panel and the outer panel.

35. An EMI shield according to claim 23 further comprising an adhesive layer that is configured to mount the EMI shield between the direct-view display panel and the outer panel.

36. An EMI shield according to claim 23 wherein the direct-view display panel is a plasma or cathode ray tube display panel.

37. An EMI shield according to claim 23 in combination with the direct-view display panel and the outer panel that provides an outer surface for the direct-view display, wherein the EMI shield is mounted between the direct-view display panel and the outer panel.

* * * * *